United States Patent [19]
Maeda

[11] Patent Number: 6,060,764
[45] Date of Patent: *May 9, 2000

[54] FIELD SHIELD ISOLATED TRANSISTOR

[75] Inventor: Shigenobu Maeda, Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/985,913

[22] Filed: Dec. 5, 1997

[30] Foreign Application Priority Data

Oct. 23, 1997 [JP] Japan .................................... 9-290899

[51] Int. Cl.$^7$ .................................................. H01L 23/58
[52] U.S. Cl. .......................... 257/630; 257/202; 257/211; 257/488; 257/659
[58] Field of Search .................................... 257/206, 202, 257/211, 488, 659, 630

[56] References Cited

U.S. PATENT DOCUMENTS 4,949,157 8/1990 Minami .
5,404,034 4/1995 Yin .......................................... 257/206

OTHER PUBLICATIONS

"CAD–Compatible High–Speed CMOS/SIMOX Technology Using Field–Shield Isolation for 1M Gate Array", T. Iwamatsu et al., Proc IEEE IEDM, 1993, pp. 475–478.

High–Speed 0.5Mu m SOI 1/8 Frequency Divider with Body–Fixed Structure for Wide Range of Applications, T. Iwamatsu et al., Extended Abstracts of the 1995 International conference on Solid State Devices and Materials, Osaka, 1995, pp. 575–577.

"Suppression of Delay Time Instability on Frequency using Field Shield Isolation Technology for Deep Sub–Micron SOI Circuits", S. Maeda et al., Proc IEEE IEDM, 1996, pp. 129–131.

*Primary Examiner*—Ngân V. Ngô
*Attorney, Agent, or Firm*—Oblon, Spivak, McClelland, Maier & Neustadt, P.C.

[57] ABSTRACT

A field shield isolated transistor is provided wherein the left-hand edge (E1) of a left-hand contact pad (51a) is positioned a distance (d5) to the right of the left-hand edge (F1) of a left-hand field shield gate electrode (41); the right-hand edge (E2) of the left-hand contact pad (51a) is positioned a distance (d6) to the right of the right-hand edge (F2) of the left-hand field shield gate electrode (41); the left-hand edge (E3) of a right-hand contact pad (52a) is positioned a distance (d7) to the left of the left-hand edge (F3) of a right-hand field shield gate electrode (42); and the right-hand edge (E4) of the right-hand contact pad (52a) is positioned a distance (d8) to the left of the right-hand edge (F4) of the right-hand field shield gate electrode (42). The right-hand edge (E2) of the left-hand contact pad (51a) and the left-hand edge (E3) of the right-hand contact pad (52a) which are positioned closer to diffusion layers (21–23) reduce the size of the MOS transistor, achieving the effective use of the area thereof.

20 Claims, 16 Drawing Sheets

F I G. 1 5
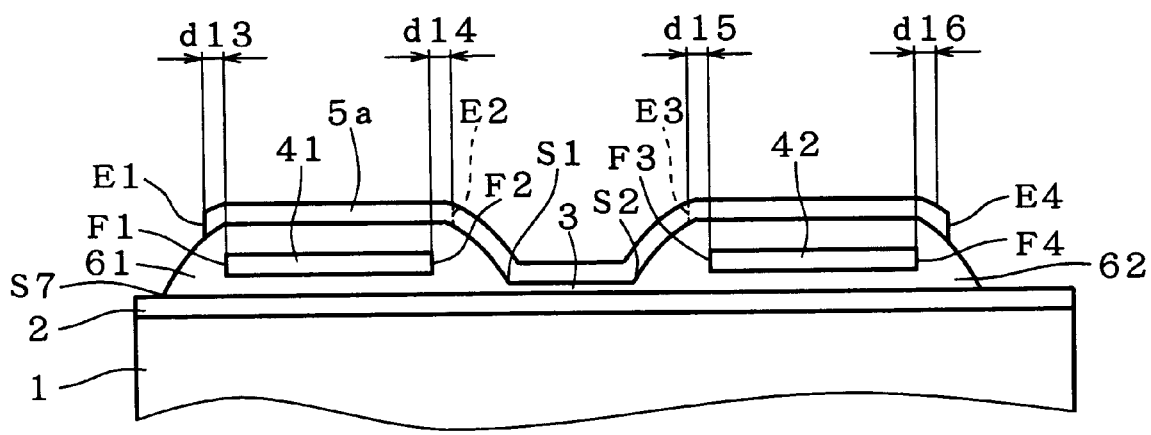

FIELD SHIELD ISOLATED TRANSISTOR

BACKGROUND OF THE INVENTION

1. Field of the Invention

The present invention relates to a transistor which is field-shield-isolated from surrounding regions.

2. Description of the Background Art

FIG. 18 is a plan view showing an application of the conventional field shield isolation technique to a gate array. FIG. 19 is a cross-sectional view taken along the line XIX—XIX of FIG. 18. For the purpose of avoiding the complication of illustration, a gate oxide film 3 to be described later is not shown in FIG. 18.

A silicon layer 2 having an SOI structure is formed on a buried oxide layer 1. Oxide films 61 and 62 are formed on the silicon layer 2, and a pair of field shield gate electrodes 41 and 42 are buried in and surrounded by the oxide films 61 and 62, respectively. Contact pads 51a and 51b of gate electrodes 5a and 5b are formed on parts of the oxide film 61 which are positioned over the field shield gate electrode 41, and contact pads 52a and 52b of the gate electrodes 5a and 5b are formed on parts of the oxide film 62 which are positioned over the field shield gate electrode 42.

The gate electrode 5a further includes a coupling portion 53a for coupling the contact pads 51a and 52a to each other. The gate electrode 5b further includes a coupling portion 53b for coupling the contact pads 51b and 52b to each other.

The gate oxide film 3 is provided between adjacent respective edges S1 and S2 of the oxide films 61 and 62. Diffusion layers 21, 22, 23 serving as either of a drain and a source are formed in part of the silicon layer 2 which is under the gate oxide film 3 and is not immediately under the coupling portions 53a and 53b.

The diffusion layers 21, 22 and the coupling portion 53a form a MOS transistor, and the diffusion layers 22, 23 and the coupling portion 53b form a MOS transistor. These MOS transistors are isolated from left-hand and right-hand external regions of FIG. 18 by applying a predetermined potential to the field shield gate electrodes 41 and 42.

In the conventional field shield isolation technique applied to the gate array, when attention is focused on the gate electrode 5a, the contact pads 51a and 52a are positioned within respective regions immediately over the field shield gate electrodes 41 and 42. More specifically, the left-hand edge E1 of the contact pad 51a is positioned a distance d1 to the right of the left-hand edge F1 of the field shield gate electrode 41; the right-hand edge E2 of the contact pad 51a is positioned a distance d2 to the left of the right-hand edge F2 of the field shield gate electrode 41; the left-hand edge E3 of the contact pad 52a is positioned a distance d3 to the right of the left-hand edge F3 of the field shield gate electrode 42; and the right-hand edge E4 of the contact pad 52a is positioned a distance d4 to the left of the right-hand edge F4 of the field shield gate electrode 42. The distances used herein mean differences in lateral positions (positions as viewed in the rightward and leftward directions) in plan view. In other words, the distances mean those within the plane in which the silicon layer 2 extends as viewed in the direction perpendicular to this plane or in the direction of the thickness of the silicon layer 2. This definition is used also in the following description.

The field shield gate electrodes 41, 42 and the gate electrodes 5a, 5b which are fabricated in different fabrication steps must be brought into positional alignment with each other. Thus, the distances d1 to d4 have been used as margins so that the contact pads 51a, 51b, 52a, 52b are positioned immediately over the field shield gate electrodes 41, 42.

However, the use of such margins increases the lateral size of the structure, resulting in ineffective use of the chip area thereof, that is, the increase in chip area.

SUMMARY OF THE INVENTION

According to a first aspect of the present invention, a field shield isolated transistor comprises: first and second diffusion layers formed in a semiconductor layer extending in first and second directions orthogonal to each other, the first and second diffusion layers being arranged in the first direction; a gate oxide film formed on the semiconductor layer between the first diffusion layer and the second diffusion layer; a gate electrode including a coupling portion formed on the gate oxide film and a first contact pad, the gate electrode and the first and second diffusion layers constituting a MOS transistor; and a first field shield electrode disposed on a first side of the first and second diffusion layers in the second direction, the first field shield electrode having first and second edges arranged in the second direction, the first contact pad having first and second edges arranged in the second direction, wherein the second edge of the first field shield electrode is closer to the first and second diffusion layers than is the first edge of the first field shield electrode as viewed in a third direction orthogonal to both of the first and second directions, wherein the second edge of the first contact pad is closer to the first and second diffusion layers than is the first edge of the first contact pad as viewed in the third direction, and wherein the second edge of the first contact pad is closer to the first and second diffusion layers than is the second edge of the first field shield electrode as viewed in the third direction.

Preferably, according to a second aspect of the present invention, in the field shield isolated transistor of the first aspect, the first edge of the first field shield electrode is closer to the first and second diffusion layers than is the first edge of the first contact pad as viewed in the third direction.

According to a third aspect of the present invention, the field shield isolated transistor comprises: first and second diffusion layers formed in a semiconductor layer extending in first and second directions orthogonal to each other, the first and second diffusion layers being arranged in the first direction; a gate oxide film formed on the semiconductor layer between the first diffusion layer and the second diffusion layer; a gate electrode including a coupling portion formed on the gate oxide film and a first contact pad, the gate electrode and the first and second diffusion layers constituting a MOS transistor; and a first field shield electrode disposed on a first side of the first and second diffusion layers in the second direction, the first field shield electrode having first and second edges arranged in the second direction, the first contact pad having first and second edges arranged in the second direction, wherein the second edge of the first field shield electrode is closer to the first and second diffusion layers than is the first edge of the first field shield electrode as viewed in a third direction orthogonal to both of the first and second directions, wherein the second edge of the first contact pad is closer to the first and second diffusion layers than is the first edge of the first contact pad as viewed in the third direction, and wherein the first edge of the first field shield electrode is closer to the first and second diffusion layers than is the first edge of the first contact pad as viewed in the third direction.

Preferably, according to a fourth aspect of the present invention, the field shield isolated transistor of the third aspect further comprises: a second field shield electrode disposed on a second side of the first and second diffusion layers in the second direction, the second side being opposite from the first side, the gate electrode further including a second contact pad, the second field shield electrode having first and second edges arranged in the second direction, the second contact pad having first and second edges arranged in the second direction, wherein the first edge of the second field shield electrode is closer to the first and second diffusion layers than is the second edge of the second field shield electrode as viewed in the third direction, wherein the first edge of the second contact pad is closer to the first and second diffusion layers than is the second edge of the second contact pad as viewed in the third direction, and wherein the first edge of the second contact pad is closer to the first and second diffusion layers than is the first edge of the second field shield electrode as viewed in the third direction.

Preferably, according to a fifth aspect of the present invention, in the field shield isolated transistor of the third aspect, the second edge of the first contact pad is closer to the first and second diffusion layers than is the second edge of the first field shield electrode as viewed in the third direction.

Preferably, according to a sixth aspect of the present invention, in the field shield isolated transistor of the first aspect, the first field shield electrode is buried in and surrounded by a first oxide film under the first contact pad; the first oxide film has first and second edges arranged in the second direction; the second edge of the first oxide film is closer to the first and second diffusion layers than is the first edge of the first oxide film as viewed in the third direction; the first edge of the first contact pad is closer to the first and second diffusion layers than is the first edge of the first oxide film as viewed in the third direction; and the second edge of the first oxide film is closer to the first and second diffusion layers than is the second edge of the first contact pad as viewed in the third direction.

Preferably, according to a seventh aspect of the present invention, in the field shield isolated transistor of the sixth aspect, part of the first oxide film which is positioned adjacent to at least one of the first and second edges of the first oxide film is recessed so that the profile of the part is convex toward the semiconductor layer.

Preferably, according to an eighth aspect of the present invention, in the field shield isolated transistor of the fourth aspect, the second field shield electrode is buried in and surrounded by a second oxide film under the second contact pad; the second oxide film has first and second edges arranged in the second direction; the first edge of the second oxide film is closer to the first and second diffusion layers than is the second edge of the second oxide film as viewed in the third direction; the second edge of the second contact pad is closer to the first and second diffusion layers than is the second edge of the second oxide film as viewed in the third direction; and the first edge of the second oxide film is closer to the first and second diffusion layers than is the first edge of the second contact pad as viewed in the third direction.

The field shield isolated transistor in accordance with the first aspect of the present invention may reduce the distance between the first contact pad and the coupling portion as viewed in the second direction to achieve the reduction in size of the MOS transistor including the first contact pad.

The field shield isolated transistor in accordance with the second aspect of the present invention may reduce the distance between the first field shield electrode and the coupling portion as viewed in the second direction to achieve size reduction for device isolation as well as produce the effects of the field shield isolated transistor of the first aspect.

The field shield isolated transistor in accordance with the third aspect of the present invention may reduce the distance between the first field shield electrode and the coupling portion as viewed in the second direction to achieve the size reduction for device isolation.

The field shield isolated transistor in accordance with the fourth aspect of the present invention may reduce the distance between the second contact pad and the coupling portion as viewed in the second direction to achieve the reduction in size of the MOS transistor including the second contact pad as well as produce the effects of the field shield isolated transistor of the third aspect.

The field shield isolated transistor in accordance with the fifth aspect of the present invention may reduce the distance between the first contact pad and the coupling portion as viewed in the second direction to achieve the reduction in size of the MOS transistor including the first contact pad as well as produce the effects of the field shield isolated transistor of the third aspect. Additionally, there is no likelihood that the first field shield electrode is exposed when a sidewall for the gate electrode by the first contact pad is formed. Further, the field shield isolated transistor of the fifth aspect reduces the stresses applied by the first contact pad to the underlying structure, suppressing leakage current in the MOS transistor.

The field shield isolated transistor in accordance with the sixth and eighth aspects of the present invention avoids the increase in parasitic capacitance.

The field shield isolated transistor in accordance with the seventh aspect of the present invention facilitates the etching for formation of the gate electrode.

It is therefore an object of the present invention to provide a field shield isolated transistor which achieves the effective use of the area thereof by changing margins.

These and other objects, features, aspects and advantages of the present invention will become more apparent from the following detailed description of the present invention when taken in conjunction with the accompanying drawings.

BRIEF DESCRIPTION OF THE DRAWINGS

FIG. 15 is a cross-sectional view of the field shield isolated transistors according to the fourth preferred embodiment;

FIG. 18 is a plan view of conventional field shield isolation; and

DESCRIPTION OF THE PREFERRED EMBODIMENTS

First Preferred Embodiment

Figure 1:
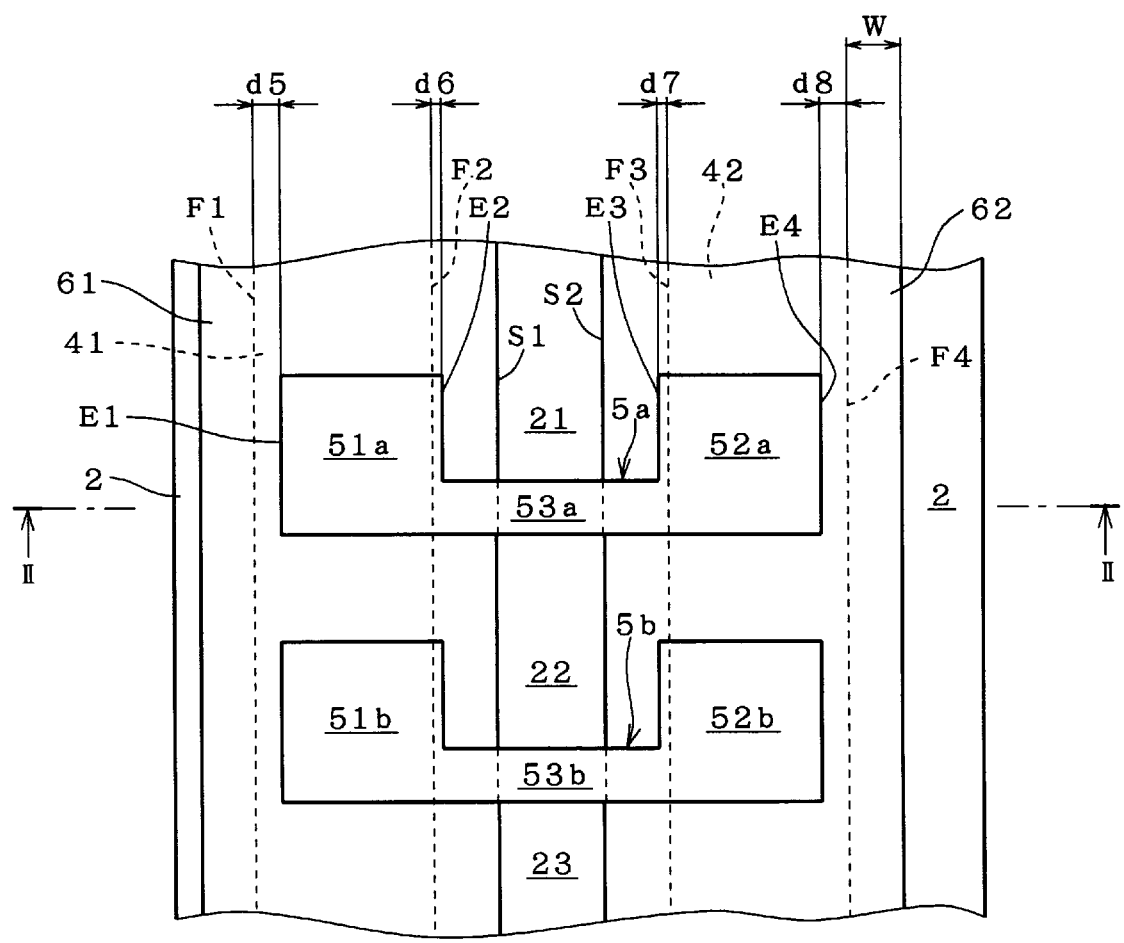
FIG. 1 is a plan view of field shield isolated transistors according to a first preferred embodiment of the present invention.
Figure 2:
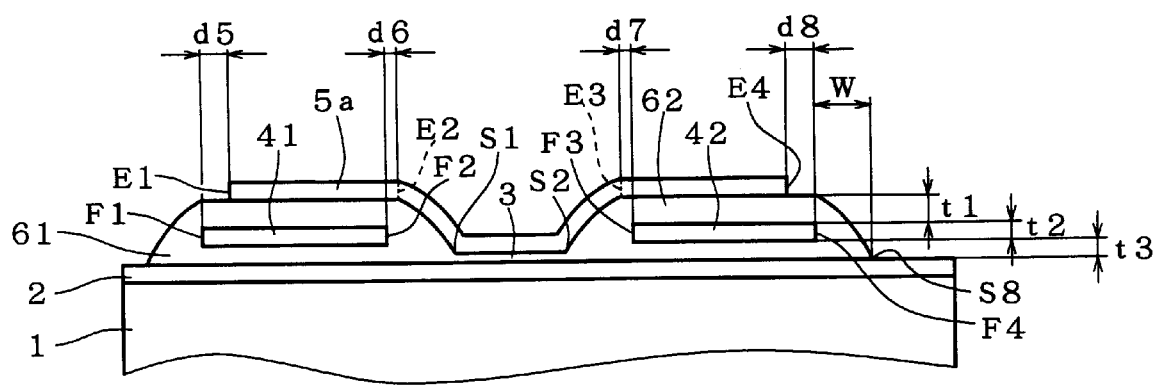
FIG. 2 is a cross-sectional view of the field shield isolated transistors according to the first preferred embodiment.

FIG. 1 is a plan view of field shield isolated transistors according to a first preferred embodiment of the present invention. FIG. 2 is a cross-sectional view taken along the line II—II of FIG. 1. For the purpose of avoiding the complication of illustration, a gate oxide film 3 is not shown in FIG. 1.

Figure 19:
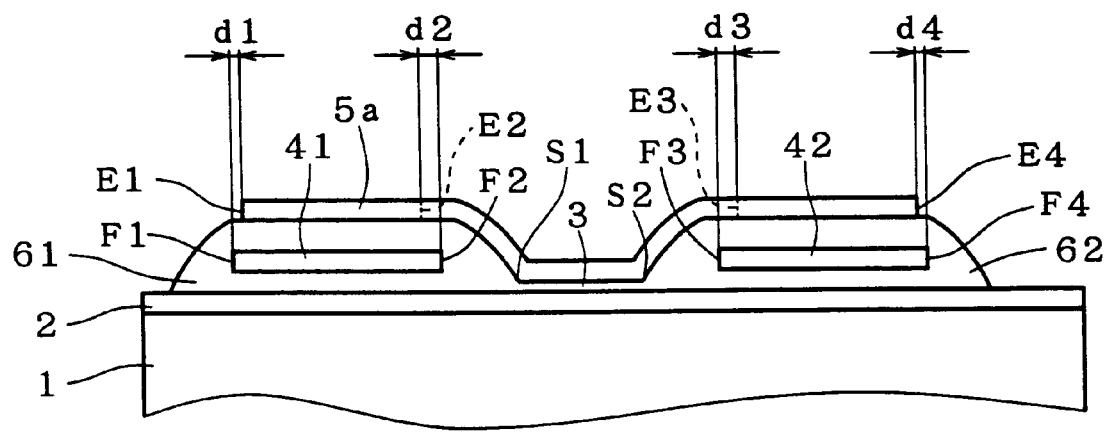
FIG. 19 is a cross-sectional view of the conventional field shield isolation.

The field shield isolated transistors shown in FIGS. 1 and 2, similar to the structure shown in FIGS. 18 and 19, are provided in a gate array, but differ from the structure of FIGS. 18 and 19 only in horizontal positional relationship between gate electrodes 5a, 5b and field shield gate electrodes 41, 42. The positional relationship referred to in the present invention is meant to include dimensions as well as positions.

For example, the thickness t2 of the field shield gate electrodes 41 and 42 is set to 500 Å; the thickness t1 of parts of oxide films 61 and 62 which are located between the field shield gate electrodes 41, 42 and contact pads 51a, 52a is set to 1000 Å; and the thickness t3 of parts of the oxide films 61 and 62 which are located between the field shield gate electrodes 41, 42 and a silicon layer 2 is set to 200 Å. The width of sidewalls for the field shield gate electrodes 41, 42, e.g., a distance W from the right-hand edge F4 of the field shield gate electrode 42 to an edge S8 of the oxide film 62 which is farther from diffusion layers 21 to 23 than is the opposite edge thereof is set to 0.2 μm, for example.

The contact pads 51a and 52a of the first preferred embodiment are displaced from those shown in FIG. 18 toward the diffusion regions 21 to 23. More specifically, the left-hand edge E1 of the contact pad 51a is positioned a distance d5 to the right of the left-hand edge F1 of the field shield gate electrode 41; the right-hand edge E2 of the contact pad 51a is positioned a distance d6 to the right of the right-hand edge F2 of the field shield gate electrode 41; the left-hand edge E3 of the contact pad 52a is positioned a distance d7 to the left of the left-hand edge F3 of the field shield gate electrode 42; and the right-hand edge E4 of the contact pad 52a is positioned a distance d8 to the left of the right-hand edge F4 of the field shield gate electrode 42.

The setting of such positional relationship between the gate electrode 5a and the field shield gate electrodes 41, 42 allows the right-hand edge E2 of the contact pad 51a and the left-hand edge E3 of the contact pad 52a to be located closer to the diffusion layers 21 to 23 by distances d2+d6 and d3+d7, respectively.

For example, if each of the distances d2 and d3 is 0.2 μm and each of the distances d6 and d7 is 0.05 μm, the spacing between the right-hand edge E2 of the contact pad 51a and the left-hand edge E3 of the contact pad 52a is reduced by a total of 0.5 μm. That is, the size of the MOS transistor including the gate electrode 5a is reduced in the direction perpendicular to the direction in which the source and drain thereof are arranged (in the lateral direction of FIG. 1).

It is, however, desirable that the right-hand edge E2 of the contact pad 51a is not closer to the diffusion layer 21 than is an edge S1 of the oxide film 61 which is closer to the diffusion layer 21 than is the opposite edge thereof so as to prevent the contact pad 51a from covering a region immediately over the diffusion layer 21 and thereby increasing a parasitic capacitance. Likewise, it is desirable that the left-hand edge E3 of the contact pad 52a is not closer to the diffusion layer 21 than is an edge S2 of the oxide film 62 which is closer to the diffusion layer 21 than is the opposite edge thereof.

Although the foregoing is described regarding to the gate electrode 5a, the same is true for the gate electrode 5b. Further, while the field shield isolation provides a large number of advantages to an SOIMOS transistor, it is apparent that the effects of the field shield isolation are also obtained if the present invention is applied to a bulk MOS transistor.

Figure 3:
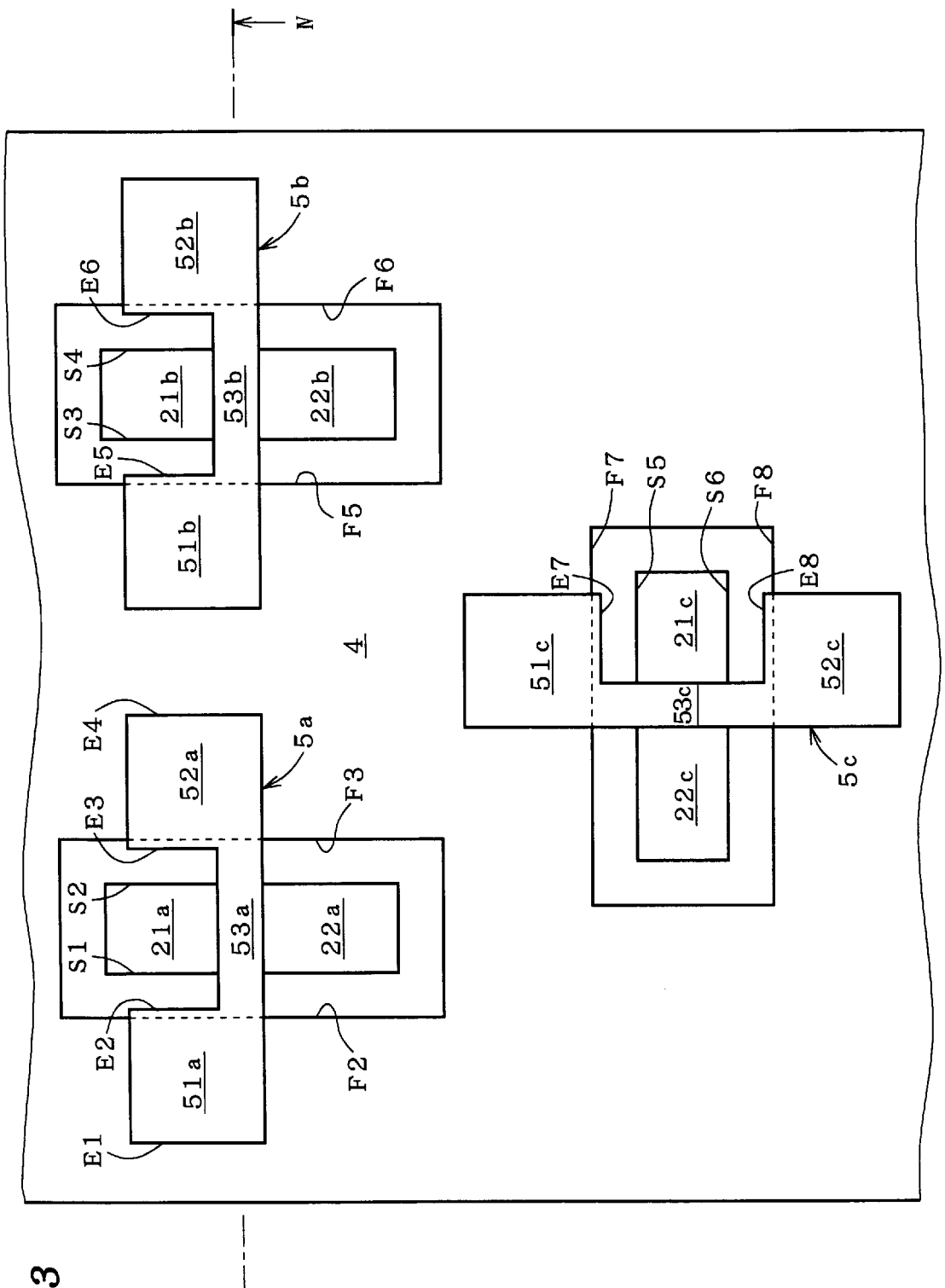
FIG. 3 is a plan view of a variation of the field shield isolated transistors according to the first preferred embodiment.
Figure 4:
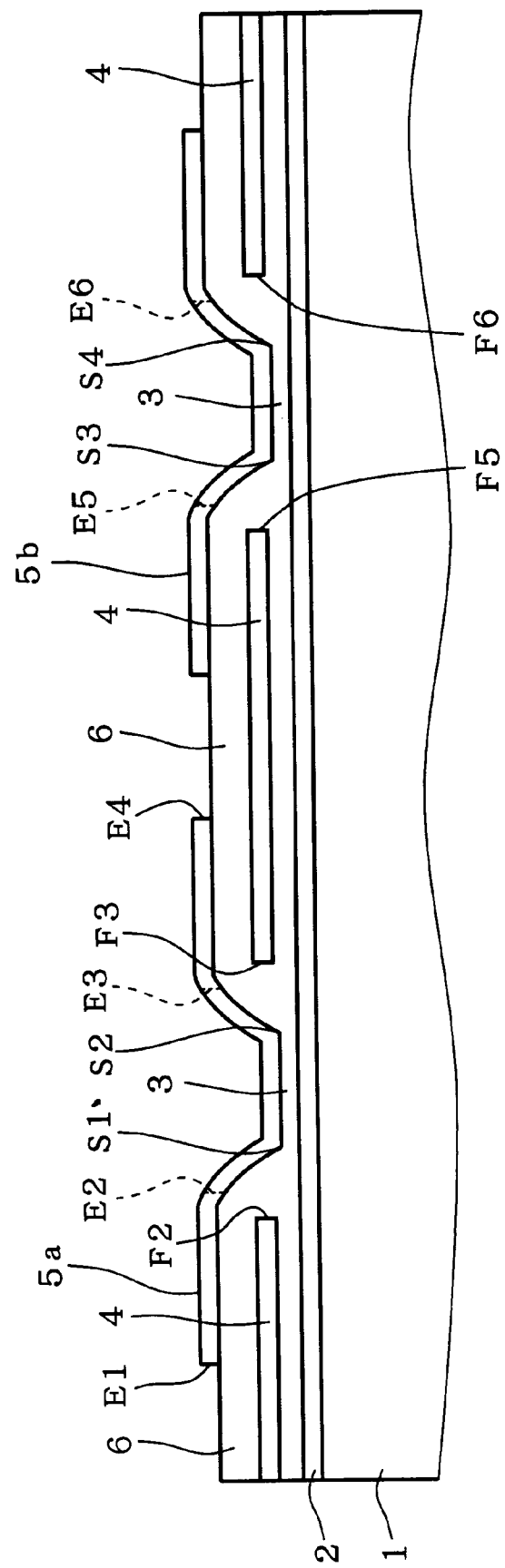
FIG. 4 is a cross-sectional view of the variation of the field shield isolated transistors according to the present invention.

Although the application of the first preferred embodiment to the gate array is described hereinabove, the first preferred embodiment may be applied to a structure comprising a plurality of randomly arranged transistors such as a microprocessor. FIG. 3 is a plan view showing the first preferred embodiment applied to field shield isolated transistors which are not arranged in the form of a gate array. FIG. 4 is a cross-sectional view taken along the line IV—IV of FIG. 3. The gate oxide film 3 and an oxide film 6 are not shown in FIG. 3. Diffusion layers 21a, 22a and a coupling portion 53a form a MOS transistor, diffusion layers 21b, 22b and a coupling portion 53b form a MOS transistor, and diffusion layers 21c, 22c and a coupling portion 53c form a MOS transistor. These MOS transistors are isolated from each other by applying a predetermined potential to a field shield gate electrode 4.

Similar to the gate electrode 5a, the gate electrode 5b comprises contact pads 51b and 52b having edges E5 and E6 which are closer to the diffusion layers 21b and 22b than are the respective opposite edges thereof. The edges E5 and E6 are closer to the diffusion layers 21b and 22b than are edges F5 and F6 of the field shield gate electrode 4 which are closer to the diffusion layers 21b and 22b than are other edges thereof, and are farther from the diffusion layers 21b and 22b than are edges S3 and S4 of the oxide film 6 which are closer to the diffusion layers 21b and 22b than are other edges thereof. The gate electrode 5c comprises contact pads 51c and 52c having edges E7 and E8 which are closer to the diffusion layers 21c and 22c than are the respective opposite edges thereof. The edges E7 and E8 are closer to the diffusion layers 21c and 22c than are edges F7 and F8 of the field shield gate electrode 4 which are closer to the diffusion layers 21c and 22c than are other edges thereof, and are farther from the diffusion layers 21c and 22c than are edges S5 and S6 of the oxide film 6 which are closer to the diffusion layers 21c and 22c than are other edges thereof.

The above described arrangement of the transistors allows the size reduction for device isolation in the direction perpendicular to the direction in which the source and drain thereof are arranged, with avoiding the increase in parasitic capacitance.

Second Preferred Embodiment

Figure 5:
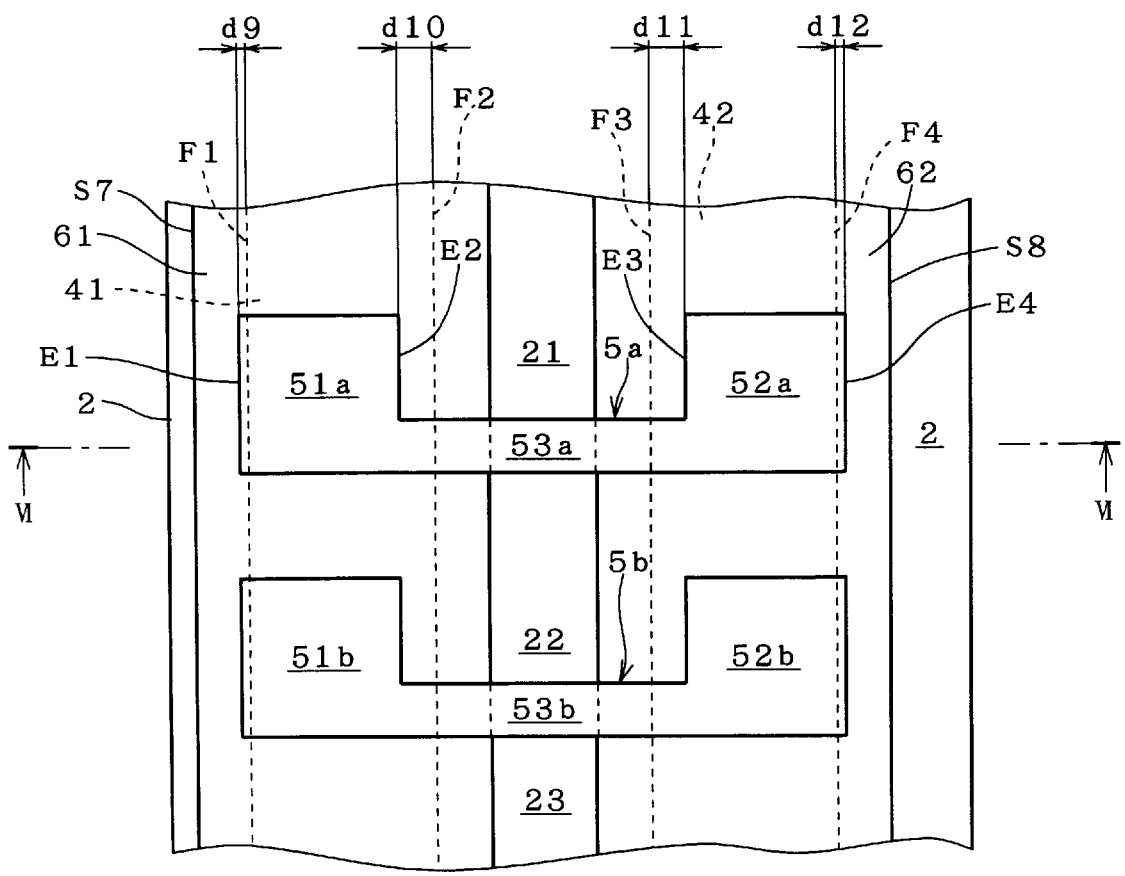
FIG. 5 is a plan view of the field shield isolated transistors according to a second preferred embodiment of the present invention.
Figure 6:
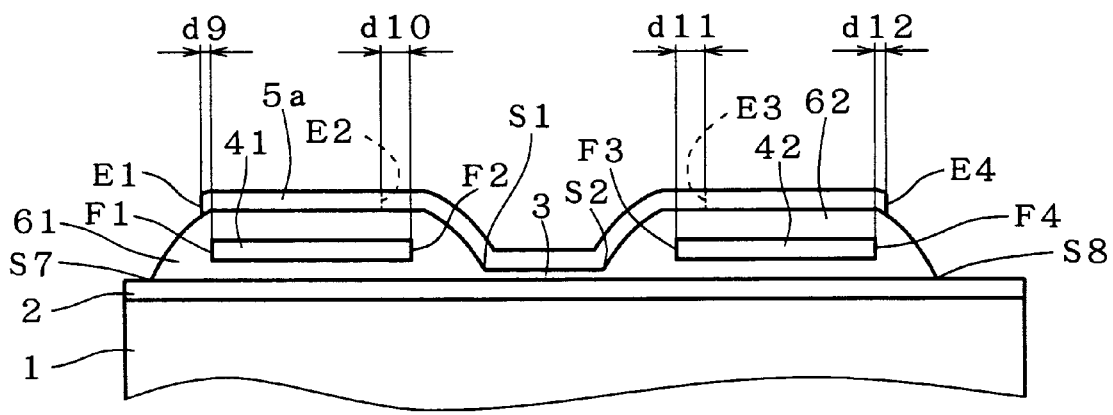
FIG. 6 is a cross-sectional view of the field shield isolated transistors according to the second preferred embodiment.

FIG. 5 is a plan view of the field shield isolated transistors according to a second preferred embodiment of the present invention. FIG. 6 is a cross-sectional view taken along the line VI—VI of FIG. 5. For the purpose of avoiding the complication of illustration, the gate oxide film 3 is not shown in FIG. 5.

The field shield isolated transistors shown in FIGS. 5 and 6, similar to the field shield isolated transistors of the first preferred embodiment, are provided in the gate array, but differs from those of the first preferred embodiment only in horizontal positional relationship between the gate electrodes 5a, 5b and the field shield gate electrodes 41, 42.

The contact pads 51a and 52a of the second preferred embodiment are displaced from those shown in FIG. 18 away from the diffusion regions 21 to 23. More specifically, the left-hand edge E1 of the contact pad 51a is positioned a distance d9 to the left of the left-hand edge F1 of the field shield gate electrode 41; the right-hand edge E2 of the contact pad 51a is positioned a distance d10 to the left of the right-hand edge F2 of the field shield gate electrode 41; the left-hand edge E3 of the contact pad 52a is positioned a distance d11 to the right of the left-hand edge F3 of the field shield gate electrode 42; and the right-hand edge E4 of the contact pad 52a is positioned a distance d12 to the right of the right-hand edge F4 of the field shield gate electrode 42.

The setting of such positional relationship between the gate electrode 5a and the field shield gate electrodes 41, 42 allows the left-hand edge F1 of the field shield gate electrode 41 and the right-hand edge F4 of the field shield gate electrode 42 to be located closer to the diffusion layers 21 to 23 by distances d1+d9 and d4+d12, respectively. That is, the size reduction for device isolation is accomplished in the direction perpendicular to the direction in which the source and drain are arranged (in the lateral direction of FIG. 5).

It is, however, desirable that the left-hand edge E1 of the contact pad 51a is not farther from the diffusion layer 21 than is an edge S7 of the oxide film 61 which is farther from the diffusion layer 21 than is the opposite edge thereof so as to prevent the contact pad 51a from covering part of the silicon layer 2 and thereby increasing a parasitic capacitance. Likewise, it is desirable that the right-hand edge E4 of the contact pad 52a is not farther from the diffusion layer 21 than is an edge S8 of the oxide film 62 which is farther from the diffusion layer 21 than is the opposite edge thereof.

When the right-hand edge E4 of the contact pad 52a is set, it is desirable that part of the oxide film 62 which is adjacent the edge S8 is recessed so that the profile of that part is convex downwardly (toward the silicon layer 2).

Figure 7A:
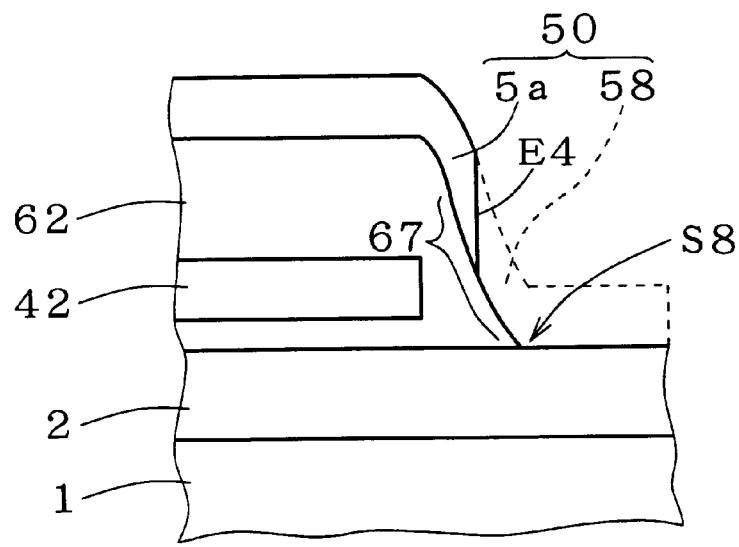
FIGS. 7A and 7B are cross-sectional views of a desirable form of the second preferred embodiment.
Figure 7B:
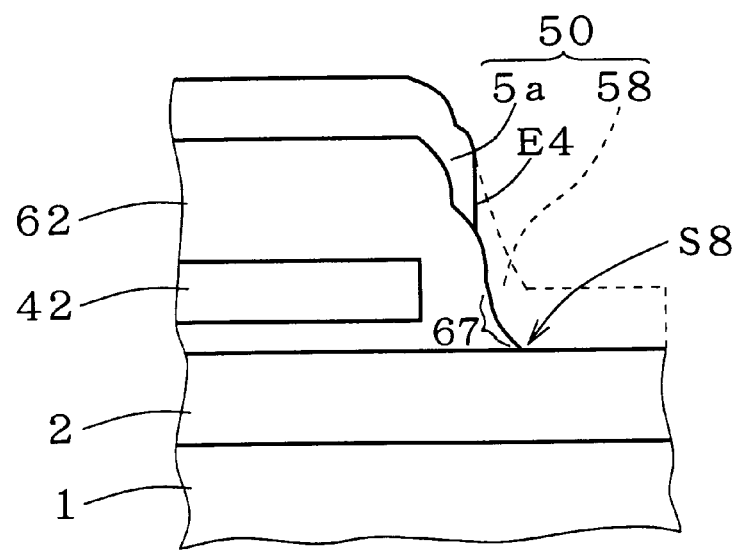

FIGS. 7A and 7B are enlarged cross-sectional views of portions adjacent the edge E4 shown in FIG. 6. A portion 67 of the oxide film 62 on which the edge E4 may be (FIG. 7A) or not (FIG. 7B) present is recessed so that the profile of a part of the portion 67, especially the part at which the portion 67 is connecting to the silicon layer 2, is convex toward the silicon layer 2.

For formation of the gate electrode 5a, a conductive material, for example, doped polysilicon 50 is deposited over the silicon layer 2 and the oxide film 62. Subsequently, a portion 58 is removed by anisotropic etching so that the right-hand edge E4 of the contact pad 52a is closer to the diffusion layer 21 than is the edge S8 of the oxide film 62.

The gently inclined profile of the portion 67 of the oxide film 62 with respect to the silicon layer 2 is advantageous in that the position of the edge E4 is correctly set and residues are difficult to produce when the portion 58 of the polysilicon 50 is etched away.

Figure 8:
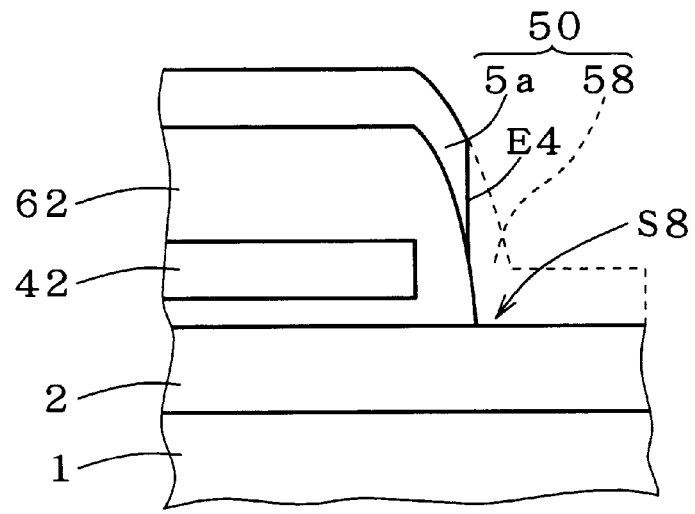
FIG. 8 is a cross-sectional view of the second preferred embodiment.

FIG. 8 is an enlarged cross-sectional view of portions adjacent the edge E4 shown in FIG. 6. A portion of the oxide film 62 on which the edge E4 is present is rounded outwardly. The structure of FIG. 8 is more difficult to set the position of the edge E4 and easier to produce residues than the structure shown in FIG. 7.

Figure 9:
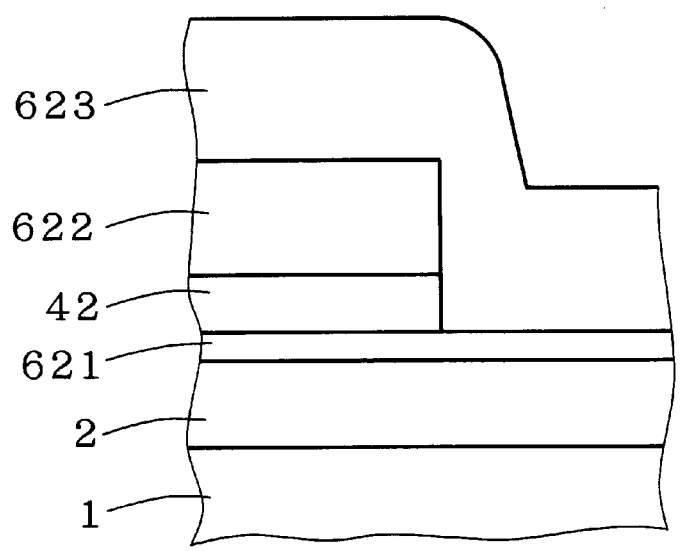
FIGS. 9 through 11 are cross-sectional views showing the desirable form of the second preferred embodiment in sequential order of fabrication steps.
Figure 10:
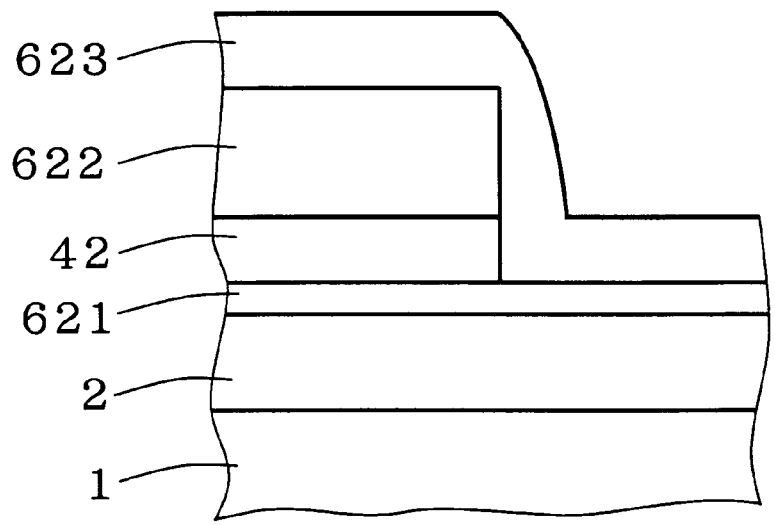
Figure 11:
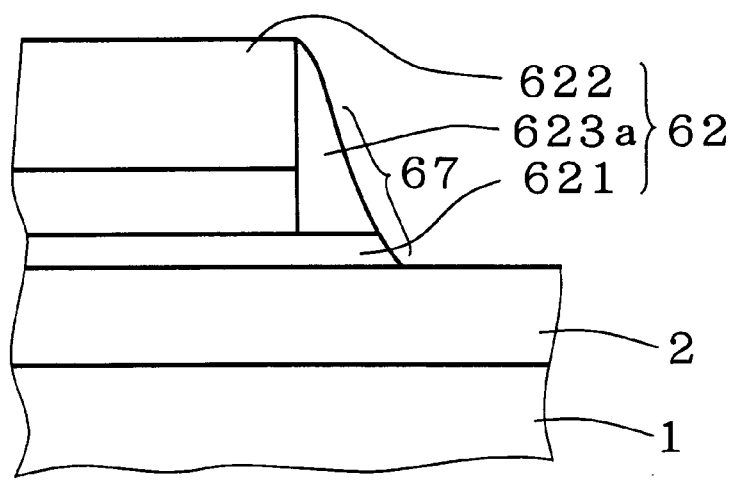

The steps of forming the portion 67 of the oxide film 62 shown in FIG. 7 are illustrated in cross sections of FIGS. 9 through 11. An oxide film 621 is formed over the silicon layer 2. The field shield gate electrode 42 with an oxide film 622 formed thereon is formed on the oxide film 621. An oxide film 623 is deposited to cover the tops of the oxide films 621 and 622 and the sides of the oxide film 622 and the field shield gate electrode 42 (FIG. 9).

Anisotropic etching which proceeds in the vertical direction at a higher etch rate is performed on the oxide film 623 to reduce the thickness of the oxide film 623 (FIG. 10). The oxide film 622 and part of the oxide film 623 which lies on the side surface of the field shield gate electrode 42 are thicker than parts of the oxide film 623 which overlie the oxide films 621 and 622, and therefore are left thick after the anisotropic etching.

Then, isotropic etching is performed to remove part of the oxide film 621 and parts of the oxide film 623 which overlie the oxide films 621 and 622. Part of the oxide film 623 which lies on the side surfaces of the oxide film 622 and field shield gate electrode 42 is left as a sidewall 623a, and part of the oxide film 621 which is located immediately under the sidewall 623a is also left. The thickness of the oxide film 622 is somewhat reduced during the isotropic etching. This isotropic etching permits the profile of the sidewall 623a to exhibit the downwardly convex profile of the portion 67.

The oxide film 621 may be exposed by isotropic etching. In this case, the portion 67 having the downwardly convex profile is closer to the edge S8.

The technique of forming the portion 67 may be applied to the left-hand edge E1 of the contact pad 51a, the left-hand edge S7 of the oxide film 61, and the gate electrode 5b.

Third Preferred Embodiment

Figure 12:
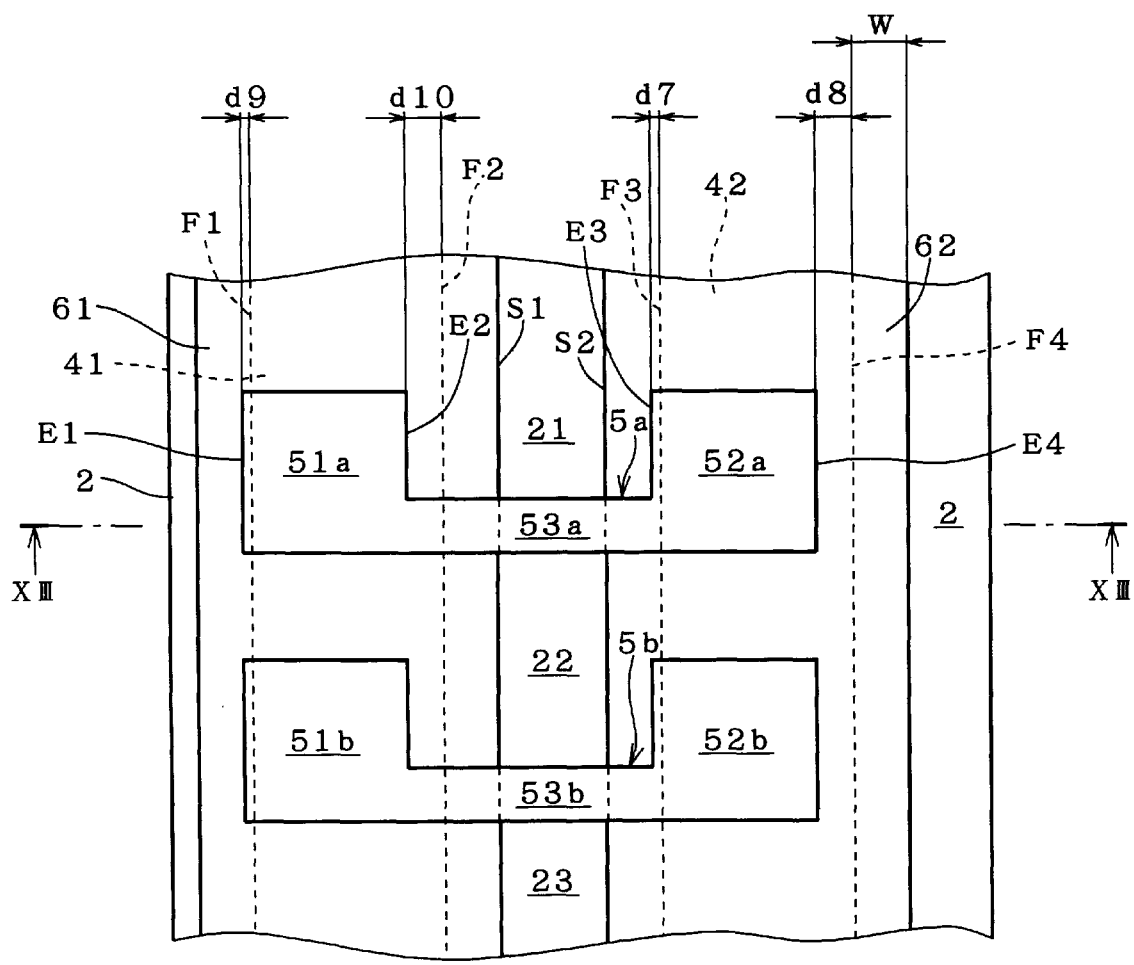
FIG. 12 is a plan view of the field shield isolated transistors according to a third preferred embodiment of the present invention.
Figure 13:
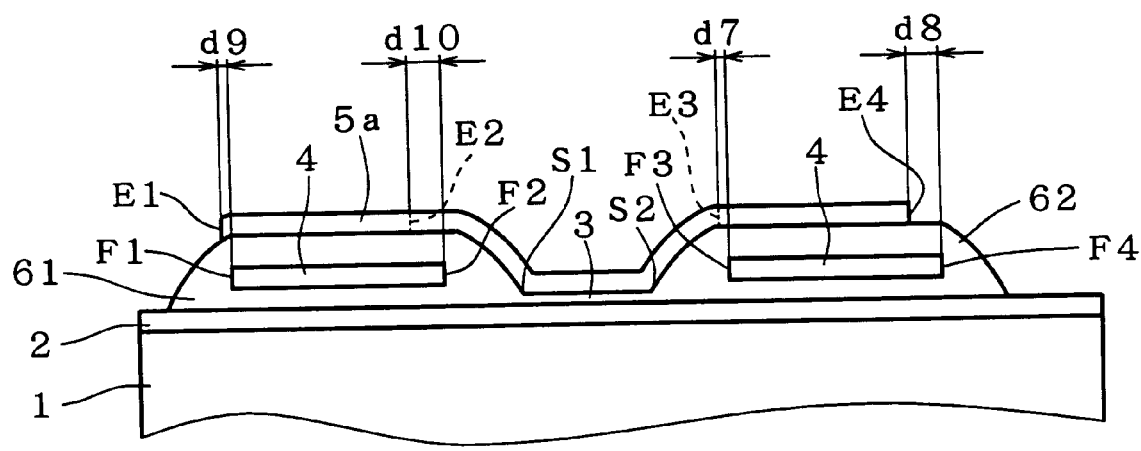
FIG. 13 is a cross-sectional view of the field shield isolated transistors according to the third preferred embodiment.

FIG. 12 is a plan view of the field shield isolated transistors according to a third preferred embodiment of the present invention. FIG. 13 is a cross-sectional view taken along the line XIII—XIII of FIG. 12. For the purpose of avoiding the complication of illustration, the gate oxide film 3 is not shown in FIG. 12.

As shown in FIGS. 12 and 13, the first preferred embodiment may be applied to the contact pad 52a of the gate electrode 5a whereas the second preferred embodiment be applied to the contact pad 51a thereof. In this structure, the MOS transistor formed by the diffusion layers 21, 22 and the coupling portion 53a achieves the reduction in area for field shield isolation on its left-hand side and the reduction in size of the transistor itself including the gate electrode 5a on its right-hand side. Both of the reductions contribute to the effective use of the area of the MOS transistor. Similar techniques may be applied to the gate electrode 5b.

Additionally, the technique of forming the portion 67 described in the second preferred embodiment may be applied to the edges E3 and S2.

Fourth Preferred Embodiment

Figure 14:
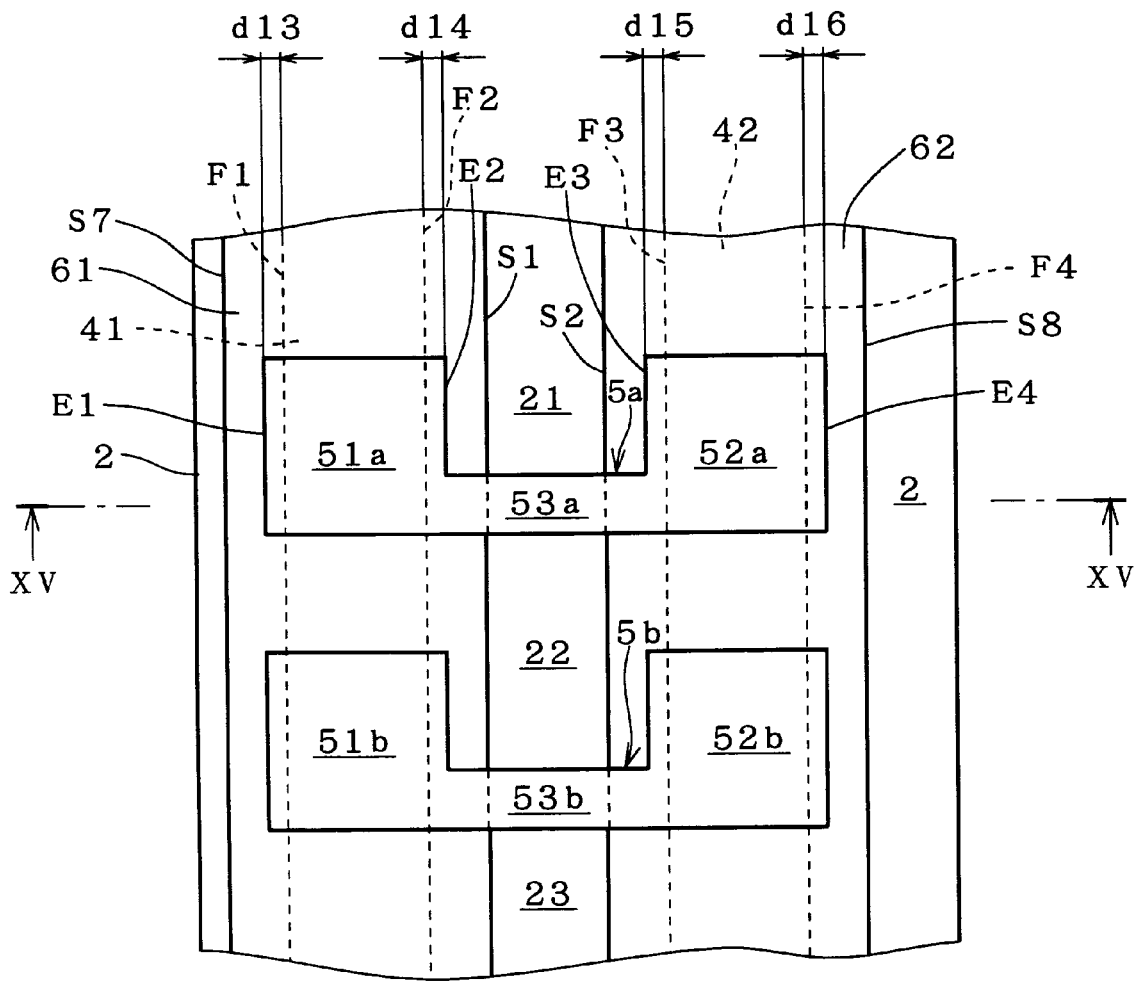
FIG. 14 is a plan view of the field shield isolated transistors according to a fourth preferred embodiment of the present invention.

FIG. 14 is a plan view of the field shield isolated transistors according to a fourth preferred embodiment of the present invention. FIG. 15 is a cross-sectional view taken along the line XV—XV of FIG. 14. For the purpose of avoiding the complication of illustration, the gate oxide film 3 is not shown in FIG. 14.

As shown in FIGS. 14 and 15, the first preferred embodiment may be applied to the right-hand edge E2 of the contact pad 51a of the gate electrode 5a and the left-hand edge E3 of the contact pad 52a thereof whereas the second preferred embodiment be applied to the left-hand edge E1 of the contact pad 51a and the right-hand edge E4 of the contact pad 52a.

More specifically, the left-hand edge E1 of the contact pad 51a is positioned a distance d13 to the left of the left-hand edge F1 of the field shield gate electrode 41; the right-hand edge E2 of ht contact pad 51a is positioned a distance d14 to the right of the right-hand edge F2 of the field shield gate electrode 41; the left-hand edge E3 of the contact pad 52a is positioned a distance d15 to the left of the left-hand edge F3 of the field shield gate electrode 42; and the right-hand edge E4 of the contact pad 52a is positioned a distance d16 to the right of the right-hand edge F4 of the field shield gate electrode 42.

Figure 16:
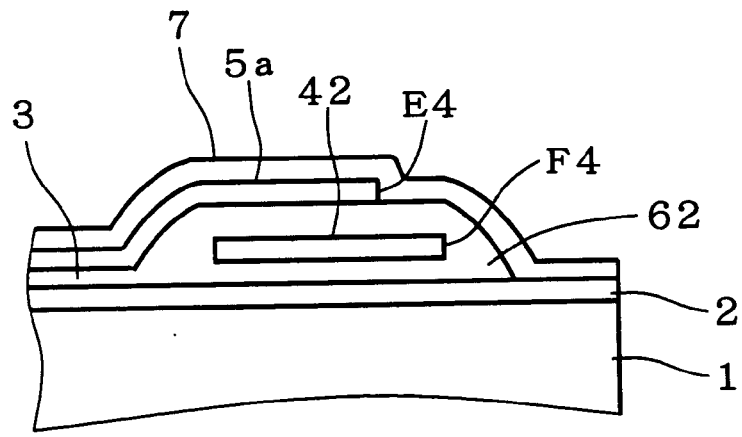
FIG. 16 is a cross-sectional view showing the step of forming a sidewall.

Such positional relationship produces a new effect as well as the effects of the first and second preferred embodiments. FIG. 16 is a cross-sectional view similar to that of FIG. 19 and showing an oxide film 7 provided for formation for the sidewall for the gate electrode 5a when the contact pad 52a has the right-hand edge E4 positioned to the left of the right-hand edge F4 of the field shield gate electrode 42.

The sidewall must be provided between the coupling portion 53a and the diffusion layers 21, 22 shown in FIG. 18, but is also formed secondarily on the right-hand edge E4 of the contact pad 52a. This results from the fact that the oxide film 7 is once formed over the top surface of the structure as shown in FIG. 11 and then etched by an etching process which is selective in the vertical direction, and the thick oxide film 7 deposited on the edge of the gate electrode 5a is left as a sidewall 71.

Figure 17:
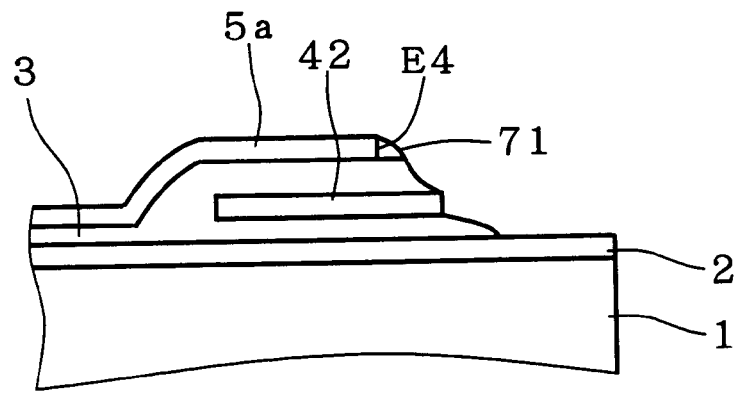
FIG. 17 is a cross-sectional view showing a field shield gate electrode 42 being exposed.
Figure 1:
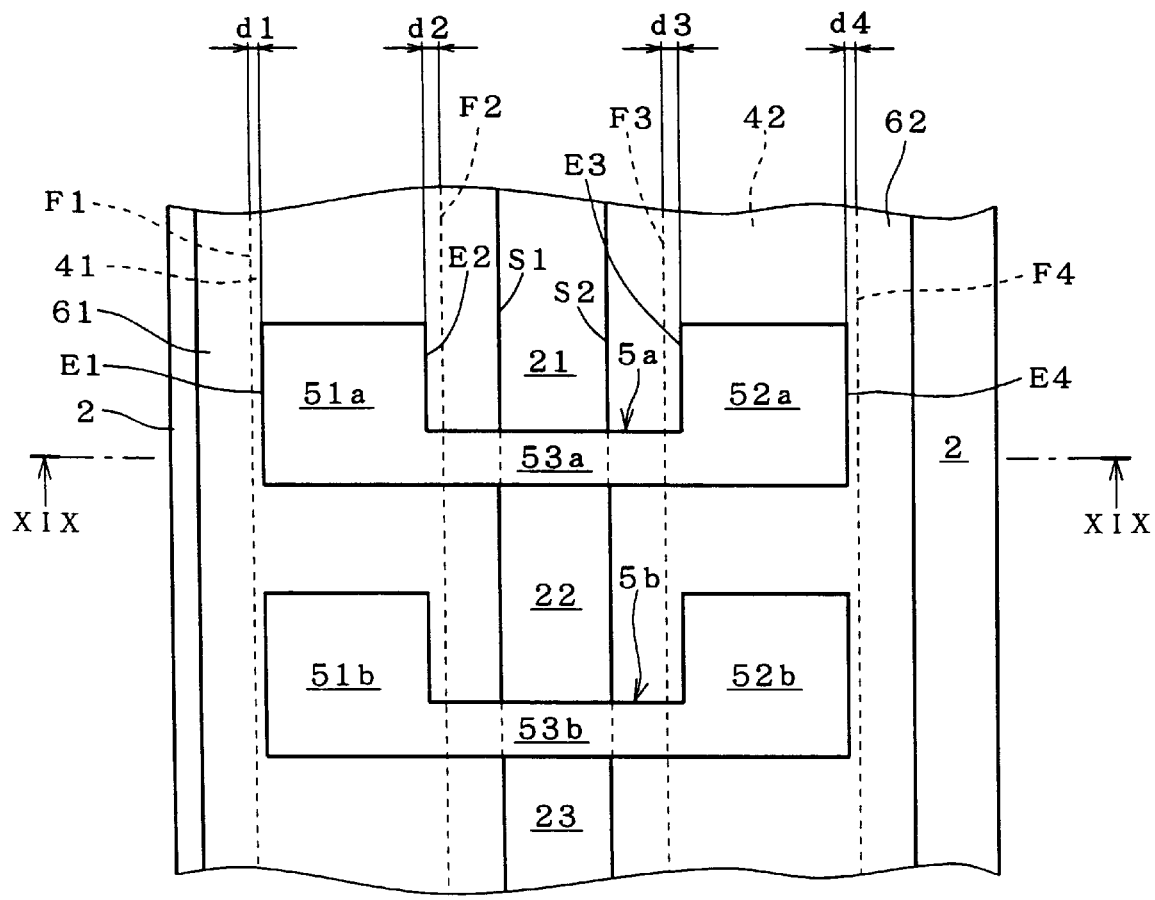

The structure of FIG. 16 is to be subjected to etching of the oxide film 7. However, since the oxide film 7 and the oxide film 62 are made of the same material, there is a likelihood that the above described etching causes the field shield gate electrode 42 to be exposed due to overetching as shown in FIG. 17.

The above described likelihood is, however, substantially eliminated by the contact pad 52a covering the left-hand and right-hand edges F3 and F4 of the field shield gate electrode 42 as shown in FIG. 15. This also reduces the stresses applied to the oxide film 62 by the contact pad 52a to suppress leakage current in the transistor.

While the invention has been described in detail, the foregoing description is in all aspects illustrative and not restrictive. It is understood that numerous other modifications and variations can be devised without departing from the scope of the invention.

I claim:

1. A field shield isolated transistor comprising:
   first and second diffusion layers formed in a semiconductor layer extending in first and second directions orthogonal to each other, said first and second diffusion layers being arranged in said first direction;
   a gate oxide film formed on said semiconductor layer between said first diffusion layer and said second diffusion layer;
   a gate electrode including a coupling portion formed on said gate oxide film and a first contact pad, said gate electrode and said first and second diffusion layers constituting a MOS transistor; and
   a first field shield electrode disposed on a first side of said first and second diffusion layers in said second direction,
   said first field shield electrode having first and second edges arranged in said second direction,
   said first contact pad having first and second edges arranged in said second direction,
   wherein said second edge of said first field shield electrode is closer to said first and second diffusion layers than is said first edge of said first field shield electrode as viewed in a third direction orthogonal to both of said first and second directions,
   wherein said second edge of said first contact pad is closer to said first and second diffusion layers than is said first edge of said first contact pad as viewed in said third direction, and
   wherein said second edge of said first contact pad is closer to said first and second diffusion layers than is said second edge of said first field shield electrode as viewed in said third direction.

2. The field shield isolated transistor according to claim 1, further comprising:
   a second field shield electrode disposed on a second side of said first and second diffusion layers in said second direction, said second side being opposite from said first side,
   said gate electrode further including a second contact pad,
   said second field shield electrode having first and second edges arranged in said second direction,
   said second contact pad having first and second edges arranged in said second direction,
   wherein said first edge of said second field shield electrode is closer to said first and second diffusion layers than is said second edge of said second field shield electrode as viewed in said third direction,
   wherein said first edge of said second contact pad is closer to said first and second diffusion layers than is said second edge of said second contact pad as viewed in said third direction, and
   wherein said first edge of said second contact pad is closer to said first and second diffusion layers than is said first edge of said second field shield electrode as viewed in said third direction.

3. The field shield isolated transistor according to claim 1, wherein said first edge of said first field shield electrode is closer to said first and second diffusion layers than is said first edge of said first contact pad as viewed in said third direction.

4. The field shield isolated transistor according to claim 3, further comprising:
   a second field shield electrode disposed on a second side of said first and second diffusion layers in said second direction, said second side being opposite from said first side,
   said gate electrode further including a second contact pad,
   said second field shield electrode having first and second edges arranged in said second direction,
   said second contact pad having first and second edges arranged in said second direction,
   wherein said first edge of said second field shield electrode is closer to said first and second diffusion layers than is said second edge of said second field shield electrode as viewed in said third direction,
   wherein said first edge of said second contact pad is closer to said first and second diffusion layers than is said second edge of said second contact pad as viewed in said third direction, wherein said first edge of said second contact pad is closer to said first and second diffusion layers than is said first edge of said second field shield electrode as viewed in said third direction, and wherein said second edge of said second field shield electrode is closer to said first and second diffusion layers than is said second edge of said second contact pad as viewed in said third direction.

5. A field shield isolated transistor comprising:

first and second diffusion layers formed in a semiconductor layer extending in first and second directions orthogonal to each other, said first and second diffusion layers being arranged in said first direction;

a gate oxide film formed on said semiconductor layer between said first diffusion layer and said second diffusion layer;

a gate electrode including a coupling portion formed on said gate oxide film and a first contact pad, said gate electrode and said first and second diffusion layers constituting a MOS transistor; and a first field shield electrode disposed on a first side of said first and second diffusion layers in said second direction, said first field shield electrode having first and second edges arranged in said second direction, said first contact pad having first and second edges arranged in said second direction, wherein said second edge of said first field shield electrode is closer to said first and second diffusion layers than is said first edge of said first field shield electrode as viewed in a third direction orthogonal to both of said first and second directions, wherein said second edge of said first contact pad is closer to said first and second diffusion layers than is said first edge of said first contact pad as viewed in said third direction, and wherein said first edge of said first field shield electrode is closer to said first and second diffusion layers than is said first edge of said first contact pad as viewed in said third direction.

6. The field shield isolated transistor according to claim 5, further comprising:

a second field shield electrode disposed on a second side of said first and second diffusion layers in said second direction, said second side being opposite from said first side, said gate electrode further including a second contact pad, said second field shield electrode having first and second edges arranged in said second direction, said second contact pad having first and second edges arranged in said second direction, wherein said first edge of said second field shield electrode is closer to said first and second diffusion layers than is said second edge of said second field shield electrode as viewed in said third direction, wherein said first edge of said second contact pad is closer to said first and second diffusion layers than is said second edge of said second contact pad as viewed in said third direction, and wherein said second edge of said second field shield electrode is closer to said first and second diffusion layers than is said second edge of said second contact pad as viewed in said third direction.

7. The field shield isolated transistor according to claim 5, further comprising:

a second field shield electrode disposed on a second side of said first and second diffusion layers in said second direction, said second side being opposite from said first side, said gate electrode further including a second contact pad, said second field shield electrode having first and second edges arranged in said second direction, said second contact pad having first and second edges arranged in said second direction, wherein said first edge of said second field shield electrode is closer to said first and second diffusion layers than is said second edge of said second field shield electrode as viewed in said third direction, wherein said first edge of said second contact pad is closer to said first and second diffusion layers than is said second edge of said second contact pad as viewed in said third direction, and wherein said first edge of said second contact pad is closer to said first and second diffusion layers than is said first edge of said second field shield electrode as viewed in said third direction.

8. The field shield isolated transistor according to claim 5, wherein said second edge of said first contact pad is closer to said first and second diffusion layers than is said second edge of said first field shield electrode as viewed in said third direction.

9. The field shield isolated transistor according to claim 8, further comprising:

a second field shield electrode disposed on a second side of said first and second diffusion layers in said second direction, said second side being opposite from said first side, said gate electrode further including a second contact pad, said second field shield electrode having first and second edges arranged in said second direction, said second contact pad having first and second edges arranged in said second direction, wherein said first edge of said second field shield electrode is closer to said first and second diffusion layers than is said second edge of said second field shield electrode as viewed in said third direction, wherein said first edge of said second contact pad is closer to said first and second diffusion layers than is said second edge of said second contact pad as viewed in said third direction, wherein said first edge of said second contact pad is closer to said first and second diffusion layers than is said first edge of said second field shield electrode as viewed in said third direction, and wherein said second edge of said second field shield electrode is closer to said first and second diffusion layers than is said second edge of said second contact pad as viewed in said third direction.

10. The field shield isolated transistor according to claim 2, wherein said first field shield electrode is buried in and surrounded by a first oxide film under said first contact pad, wherein said first oxide film has first and second edges arranged in said second direction, wherein said second edge of said first oxide film is closer to said first and second diffusion layers than is said first edge of said first oxide film as viewed in said third direction, wherein said first edge of said first contact pad is closer to said first and second diffusion layers than is said first edge of said first oxide film as viewed in said third direction, and wherein said second edge of said first oxide film is closer to said first and second diffusion layers than is said second edge of said first contact pad as viewed in said third direction.

11. The field shield isolated transistor according to claim 3, wherein said first field shield electrode is buried in and surrounded by a first oxide film under said first contact pad, wherein said first oxide film has first and second edges arranged in said second direction, wherein said second edge of said first oxide film is closer to said first and second diffusion layers than is said first edge of said first oxide film as viewed in said third direction, wherein said first edge of said first contact pad is closer to said first and second diffusion layers than is said first edge of said first oxide film as viewed in said third direction, and wherein said second edge of said first oxide film is closer to said first and second diffusion layers than is said second edge of said first contact pad as viewed in said third direction.

12. The field shield isolated transistor according to claim 6, wherein said first field shield electrode is buried in and surrounded by a first oxide film under said first contact pad, wherein said first oxide film has first and second edges arranged in said second direction, wherein said second edge of said first oxide film is closer to said first and second diffusion layers than is said first edge of said first oxide film as viewed in said third direction, wherein said first edge of said first contact pad is closer to said first and second diffusion layers than is said first edge of said first oxide film as viewed in said third direction, and wherein said second edge of said first oxide film is closer to said first and second diffusion layers than is said second edge of said first contact pad as viewed in said third direction.

13. The field shield isolated transistor according to claim 7, wherein said first field shield electrode is buried in and surrounded by a first oxide film under said first contact pad, wherein said first oxide film has first and second edges arranged in said second direction, wherein said second edge of said first oxide film is closer to said first and second diffusion layers than is said first edge of said first oxide film as viewed in said third direction, wherein said first edge of said first contact pad is closer to said first and second diffusion layers than is said first edge of said first oxide film as viewed in said third direction, and wherein said second edge of said first oxide film is closer to said first and second diffusion layers than is said second edge of said first contact pad as viewed in said third direction.

14. The field shield isolated transistor according to claim 8, wherein said first field shield electrode is buried in and surrounded by a first oxide film under said first contact pad, wherein said first oxide film has first and second edges arranged in said second direction, wherein said second edge of said first oxide film is closer to said first and second diffusion layers than is said first edge of said first oxide film as viewed in said third direction, wherein said first edge of said first contact pad is closer to said first and second diffusion layers than is said first edge of said first oxide film as viewed in said third direction, and wherein said second edge of said first oxide film is closer to said first and second diffusion layers than is said second edge of said first contact pad as viewed in said third direction.

15. The field shield isolated transistor according to claim 10, wherein part of said first oxide film which is positioned adjacent to at least one of said first and second edges of said first oxide film is recessed so that the profile of said part is convex toward said semiconductor layer.

16. The field shield isolated transistor according to claim 11, wherein part of said first oxide film which is positioned adjacent to at least one of said first and second edges of said first oxide film is recessed so that the profile of said part is convex toward said semiconductor layer.

17. The field shield isolated transistor according to claim 12, wherein part of said first oxide film which is positioned adjacent to at least one of said first and second edges of said first oxide film is recessed so that the profile of said part is convex toward said semiconductor layer.

18. The field shield isolated transistor according to claim 13, wherein part of said first oxide film which is positioned adjacent to at least one of said first and second edges of said first oxide film is recessed so that the profile of said part is convex toward said semiconductor layer.

19. The field shield isolated transistor according to claim 14, wherein part of said first oxide film which is positioned adjacent to at least one of said first and second edges of said first oxide film is recessed so that the profile of said part is convex toward said semiconductor layer.

20. The field shield isolated transistor according to claim 7, wherein said second field shield electrode is buried in and surrounded by a second oxide film under said second contact pad, wherein said second oxide film has first and second edges arranged in said second direction, wherein said first edge of said second oxide film is closer to said first and second diffusion layers than is said second edge of said second oxide film as viewed in said third direction, wherein said second edge of said second contact pad is closer to said first and second diffusion layers than is said second edge of said second oxide film as viewed in said third direction, and wherein said first edge of said second oxide film is closer to said first and second diffusion layers than is said first edge of said second contact pad as viewed in said third direction.

* * * * *

UNITED STATES PATENT AND TRADEMARK OFFICE
CERTIFICATE OF CORRECTION

PATENT NO.   : 6,060,764
DATED        : May 9, 2000
INVENTOR(S)  : Maeda

It is certified that error appears in the above-identified patent and that said Letters Patent is hereby corrected as shown below:

<u>Columns 9-14,</u>
Delete claims 1-20 and substitute claims 1-47 as attached.

Signed and Sealed this

Ninth Day of May, 2006

JON W. DUDAS
*Director of the United States Patent and Trademark Office*

Additionally, the technique of forming the portion 67 described in the second preferred embodiment may be applied to the edges E3 and S2.

Fourth Preferred Embodiment

FIG. 14 is a plan view of the field shield isolated transistors according to a fourth preferred embodiment of the present invention. FIG. 15 is a cross-sectional view taken along the line XV—XV of FIG. 14. For the purpose of avoiding the complication of illustration, the gate oxide film 3 is not shown in FIG. 14.

As shown in FIGS. 14 and 15, the first preferred embodiment may be applied to the right-hand edge E2 of the contact pad 51a of the gate electrode 5a and the left-hand edge E3 of the contact pad 52a thereof whereas the second preferred embodiment be applied to the left-hand edge E1 of the contact pad 51a and the right-hand edge E4 of the contact pad 52a.

More specifically, the left-hand edge E1 of the contact pad 51a is positioned a distance d13 to the left of the left-hand edge F1 of the field shield gate electrode 41; the right-hand edge E2 of ht contact pad 51a is positioned a distance d14 to the right of the right-hand edge F2 of the field shield gate electrode 41; the left-hand edge E3 of the contact pad 52a is positioned a distance d15 to the left of the left-hand edge F3 of the field shield gate electrode 42; and the right-hand edge E4 of the contact pad 52a is positioned a distance d16 to the right of the right-hand edge F4 of the field shield gate electrode 42.

Such positional relationship produces a new effect as well as the effects of the first and second preferred embodiments. FIG. 16 is a cross-sectional view similar to that of FIG. 19 and showing an oxide film 7 provided for formation for the sidewall for the gate electrode 5a when the contact pad 52a has the right-hand edge E4 positioned to the left of the right-hand edge F4 of the field shield gate electrode 42.

The sidewall must be provided between the coupling portion 53a and the diffusion layers 21, 22 shown in FIG. 18, but is also formed secondarily on the right-hand edge E4 of the contact pad 52a. This results from the fact that the oxide film 7 is once formed over the top surface of the structure as shown in FIG. 11 and then etched by an etching process which is selective in the vertical direction, and the thick oxide film 7 deposited on the edge of the gate electrode 5a is left as a sidewall 71.

The structure of FIG. 16 is to be subjected to etching of the oxide film 7. However, since the oxide film 7 and the oxide film 62 are made of the same material, there is a likelihood that the above described etching causes the field shield gate electrode 42 to be exposed due to overetching as shown in FIG. 17.

The above described likelihood is, however, substantially eliminated by the contact pad 52a covering the left-hand and right-hand edges F3 and F4 of the field shield gate electrode 42 as shown in FIG. 15. This also reduces the stresses applied to the oxide film 62 by the contact pad 52a to suppress leakage current in the transistor.

While the invention has been described in detail, the foregoing description is in all aspects illustrative and not restrictive. It is understood that numerous other modifications and variations can be devised without departing from the scope of the invention.

I claim:

1. A field shield isolated transistor comprising:

first and second diffusion layers formed in a semiconductor layer extending in first and second directions orthogonal to each other, said first and second diffusion layers being arranged in said first direction;

a gate oxide film formed on said semiconductor layer between said first diffusion layer and said second diffusion layer;

a gate electrode including a coupling portion formed on said gate oxide film and a first contact pad, said gate electrode and said first and second diffusion layers constituting a MOS transistor; and a first field shield electrode disposed on a first side of said first and second diffusion layers in said second direction, said first field shield electrode having first and second edges arranged in said second direction, said first contact pad having first and second edges arranged in said second direction, wherein said second edge of said first field shield electrode is closer to said first and second diffusion layers than is said first edge of said first field shield electrode as viewed in a third direction orthogonal to both of said first and second directions, wherein said second edge of said first contact pad is closer to said first and second diffusion layers than is said first edge of said first contact pad as viewed in said third direction, and wherein said second edge of said first contact pad is closer to said first and second diffusion layers than is said second edge of said first field shield electrode as viewed in said third direction.

2. The field shield isolated transistor according to claim 1, further comprising:

a second field shield electrode disposed on a second side of said first and second diffusion layers in said second direction, said second side being opposite from said first side, said gate electrode further including a second contact pad, said second field shield electrode having first and second edges arranged in said second direction, said second contact pad having first and second edges arranged in said second direction, wherein said first edge of second field shield electrode is closer to said first and second diffusion layers than is said second edge of said second field shield electrode as viewed in said third direction, wherein said first edge of said second contact pad is closer to said first and second diffusion layers than is said second edge of said second contact pad as viewed in said third direction, and wherein said first edge of said second contact pad is closer to said first and second diffusion layers than is said first edge of said second field shield electrode as viewed in said third direction.

3. The field shield isolated transistor according to claim 1, wherein said first edge of said first field shield electrode is closer to said first and second diffusion layers than is said first edge of said first contact pad as viewed in said third direction.

4. The field shield isolated transistor according to claim 3, further comprising:

a second field shield electrode disposed on a second side of said first and second diffusion layers in said second direction, said second side being opposite from said first side, said gate electrode further including a second contact pad, said second field shield electrode having first and second edges arranged in said second direction, said second contact pad having first and second edges arranged in said second direction, wherein said first edge of said second field shield electrode is closer to said first and second diffusion layers than is said second edge of said second field shield electrode as viewed in said third direction, wherein said first edge of said second contact pad is closer to said first and second diffusion layers than is said second edge of said second contact pad as viewed in said third direction, wherein said first edge of said second contact pad is closer to said first and second diffusion layers than is said first edge of said second field shield electrode as viewed in said third direction, and wherein said second edge of said second field shield electrode is closer to said first and second diffusion layers than is said second edge of said second contact pad as viewed in said third direction.

5. A field shield isolated transistor comprising:

first and second diffusion layers formed in a semiconductor layer extending in first and second directions orthogonal to each other, said first and second diffusion layers being arranged in said first direction;

a gate oxide film formed on said semiconductor layer between said first diffusion layer and said second diffusion layer;

a gate electrode including a coupling portion formed on said gate oxide film and a first contact pad, said gate electrode and said first and second diffusion layers constituting a MOS transistor; and a first field shield electrode disposed on a first side of said first and second diffusion layers in said second direction, said first field shield electrode having first and second edges arranged in said second direction, said first contact pad having first and second edges arranged in said second direction, wherein said second edge of said first field shield electrode is closer to said first and second diffusion layers than is said first edge of said first field shield electrode as viewed in a third direction orthogonal to both of said first and second directions, wherein said second edge of said first contact pad is closer to said first and second diffusion layers than is said first edge of said first contact pad as viewed in said third direction, and wherein said first edge of said first field shield electrode is closer to said first and second diffusion layers than is said first edge of said first contact pad as viewed in said third direction.

6. The field shield isolated transistor according to claim 5, further comprising:

a second field shield electrode disposed on a second side of said first and second diffusion layers in said second direction, said second side being opposite from said first side, said gate electrode further including a second contact pad, said second field shield electrode having first and second edges arranged in said second direction, said second contact pad having first and second edges arranged in said second direction, wherein said first edge of said second field shield electrode is closer to said first and second diffusion layers than is said second edge of said second field shield electrode as viewed in said third direction, wherein said first edge of said second contact pad is closer to said first and second diffusion layers than is said second edge of said second contact pad as viewed in said third direction, and wherein said second edge of said second field shield electrode is closer to said first and second diffusion layers than is said second edge of said second contact pad as viewed in said third direction.

7. The field shield isolated transistor according to claim 5, further comprising:

a second field shield electrode disposed on a second side of said first and second diffusion layers in said second direction, said second side being opposite from said first side, said gate electrode further including a second contact pad, said second field shield electrode having first and second edges arranged in said second direction, said second contact pad having first and second edges arranged in said second direction, wherein said first edge of said second field shield electrode is closer to said first and second diffusion layers than is said second edge of said second field shield electrode as viewed in said third direction, wherein said first edge of said second contact pad is closer to said first and second diffusion layers than is said second edge of said second contact pad as viewed in said third direction, and wherein said first edge of said second contact pad is closer to said first and second diffusion layers than is said first edge of said second field shield electrode as viewed in said third direction.

8. The field shield isolated transistor according to claim 5, wherein said second edge of said first contact pad is closer to said first and second diffusion layers than is said second edge of said first field shield electrode as viewed in said third direction.

9. The field shield isolated transistor according to claim 8, further comprising:

a second field shield electrode disposed on a second side of said first and second diffusion layers in said second direction, said second side being opposite from said first side, said gate electrode further including a second contact pad, said second field shield electrode having first and second edges arranged in said second direction, said second contact pad having first and second edges arranged in said second direction, wherein said first edge of said second field shield electrode is closer to said first and second diffusion layers than is said second edge of said second field shield electrode as viewed in said third direction, wherein said first edge of said second contact pad is closer to said first and second diffusion layers than is said second edge of said second contact pad as viewed in said third direction, wherein said first edge of said second contact pad is closer to said first and second diffusion layers than is said first edge of said second field shield electrode as viewed in said third direction, and wherein said second edge of said second field shield electrode is closer to said first and second diffusion layers than is said second edge of said second contact pad as viewed in said third direction.

10. The field shield isolated transistor according to claim 2, wherein said first field shield electrode is buried in and surrounded by a first oxide film under said first contact pad, wherein said first oxide film has first and second edges arranged in said second direction, wherein said second edge of said first oxide film is closer to said first second diffusion layers than is said first edge of said first oxide film as viewed in said third direction, wherein said first edge of said first contact pad is closer to said first and second diffusion layers than is said first edge of said first oxide film as viewed in said third direction, wherein said second edge of said first oxide film is closer to said first and second diffusion layers than is said second edge of said first contact pad as viewed in said third direction.

11. The field shield isolated transistor according to claim 3, wherein said first field shield electrode is buried in and surrounded by a first oxide film under said first contact pad, wherein said first oxide film has first and second edges arranged in said second direction, wherein said second edge of said first oxide film is closer to said first and second diffusion layers than is said first edge of said first oxide film as viewed in said third direction, wherein said first edge of said first contact pad is closer to said first and second diffusion layers than is said first edge of said first oxide film as viewed in said third direction, and wherein said second edge of said first oxide film is closer to said first and second diffusion layers than is said second edge of said first contact pad as viewed in said third direction.

12. The field shield isolated transistor according to claim 6, wherein said first field shield electrode is buried in and surrounded by a first oxide film under said first contact pad, wherein said first oxide film has first and second edges arranged in said second direction, wherein said second edge of said first oxide film is closer to said first and second diffusion layers than is said first edge of said first oxide film as viewed in said third direction, wherein said first edge of said first contact pad is closer to said first and second diffusion layers than is said first edge of said first oxide film as viewed in said third direction, and wherein said second edge of said first oxide film is closer to said first and second diffusion layers than is said second edge of said first contact pad as viewed in said third direction.

13. The field shield isolated transistor according to claim 7, wherein said first field shield electrode is buried in and surrounded by a first oxide film under said first contact pad, wherein said first oxide film has first and second edges arranged in said second direction, wherein said second edge of said first oxide film is closer to said first and second diffusion layers than is said first edge of said first oxide film as viewed in said third direction, wherein said first edge of said first contact pad is closer to said first and second diffusion layers than is said first edge of said first oxide film as viewed in said third direction, and wherein said second edge of said first oxide film is closer to said first and second diffusion layers than is said second edge of said first contact pad as viewed in said third direction.

14. The field shield isolated transistor according to claim 8, wherein said first field shield electrode is buried in and surrounded by a first oxide film under said first contact pad, wherein said first oxide film has first and second edges arranged in said second direction, wherein said second edge of said first oxide film is closer to said first and second diffusion layers than is said first edge of said first oxide film as viewed in said third direction, wherein said first edge of said first contact pad is closer to said first and second diffusion layers than is said first edge of said first oxide film as viewed in said third direction, and wherein said second edge of said first oxide film is closer to said first and second diffusion layers than is said second edge of said first contact pad as viewed in said third direction.

15. The field shield isolated transistor according to claim 10, wherein part of said first oxide film which is positioned adjacent to at least one of said first and second edges of said first oxide film is recessed so that the profile of said part is convex toward said semiconductor layer.

16. The field shield isolated transistor according to claim 1, wherein part of said first oxide film which is positioned adjacent to at least one of said first and second edges of said first oxide film is recessed so that the profile of said part is convex toward said semiconductor layer.

17. The field shield isolated transistor according to claim 2, wherein part of said first oxide film which is positioned adjacent to at least one of said first and second edges of said first oxide film is recessed so that the profile of said part is convex toward said semiconductor layer.

18. The field shield isolated transistor according to claim 3, wherein part of said first oxide film which is positioned adjacent to at least one of said first and second edges of said first oxide film is recessed so that the profile of said part is convex toward said semiconductor layer.

19. The field shield isolated transistor according to claim 4, wherein part of said first oxide film which is positioned adjacent to at least one of said first and second edges of said first oxide film is recessed so that the profile of said part is convex toward said semiconductor layer.

20. The field shield isolated transistor according to claim 7, wherein said second field shield electrode is buried in and surrounded by a second oxide film under said second contact pad, wherein said second oxide film has first and second edges arranged in said second direction, wherein said first edge of said second oxide film is closer to said first and second diffuision layers than is said second edge of said second oxide film as viewed in said third direction, wherein said second edge of said second contact pad is closer to said first and second diffuision layers than is said second edge of said second oxide film as viewed in said third direction, and wherein said first edge of said second oxide film is closer to said first and second diffusion layers than is said first edge of said second contact pad as viewed in said third direction.

21. A field shield isolated transistor comprising:

first and second diffusion layers formed in a semiconductor substrate extending in first and second directions orthogonal to each other, said first and second diffusion layers being arranged in said first direction;

a gate oxide film formed on said semiconductor substrate between said first diffusion layer and said second diffusion layer;

a gate electrode including a coupling portion formed on said gate oxide film and a first contact pad, said gate electrode and said first and second diffusion layers constituting a MOS transistor; and a first field shield electrode disposed on a first side of said first and second diffusion layers in said second direction, said first field shield electrode having first and second edges arranged in said second direction, said first contact pad having first and second edges arranged in said second direction, wherein said second edge of said first field shield electrode is closer to said first and second diffusion layers than is said first edge of said first field shield electrode as viewed in a third direction orthogonal to both of said first and second directions, wherein said second edge of said first contact pad is closer to said first and second diffusion layers than is said first edge of said first contact pad as viewed in said third direction, and wherein said second edge of said first contact pad is closer to said first and second diffusion layers than is said second edge of said first field shield electrode as viewed in said third direction.

22. The field shield isolated transistor according to claim 21, further comprising:

a second field shield electrode disposed on a second side of said first and second diffusion layers in said second direction, said second side being opposite from said first side, said gate electrode further including a second contact pad, said second field shield electrode having first and second edges arranged in said second direction, said second contact pad having first and second edges arranged in said second direction, wherein said first edge of said second field shield electrode is closer to said first and second diffusion layers than is said second edge of said second field shield electrode as viewed in said third direction, wherein said first edge of said second contact pad is closer to said first and second diffusion layers than is said second edge of said second contact pad as viewed in said third direction, and wherein said first edge of said second contact pad is closer to said first and second diffusion layers than is said first edge of said second field shield electrode as viewed in said third direction.

23. The field shield isolated transistor according to claim 21, wherein said first edge of said first field shield electrode is closer to said first and second diffusion layers than is said first edge of said first contact pad as viewed in said third direction.

24. The field shield isolated transistor according to claim 23, further comprising:

a second field shield electrode disposed on a second side of said first and second diffusion layers in said second direction, said second side being opposite from said first side, said gate electrode further including a second contact pad, said second field shield electrode having first and second edges arranged in said second direction, said second contact pad having first and second edges arranged in said second direction, wherein said first edge of said second field shield electrode is closer to said first and second diffusion layers than is said second edge of said second field shield electrode as viewed in said third direction, wherein said first edge of said second contact pad is closer to said first and second diffusion layers than is said second edge of said second contact pad as viewed in said third direction, wherein said first edge of said second contact pad is closer to said first and second diffusion layers than is said first edge of said second field shield electrode as viewed in said third direction, and wherein said second edge of said second field shield electrode is closer to said first and second diffusion layers than is said second edge of said second contact pad as viewed in said third direction.

25. A field shield isolated transistor comprising:

first and second diffusion layers formed in a semiconductor substrate extending in first and second directions orthogonal to each other, said first and second diffusion layers being arranged in said first direction;

a gate oxide film formed on said semiconductor substrate between said first diffusion layer and said second diffusion layer;

a gate electrode including a coupling portion formed on said gate oxide film and a first contact pad, said gate electrode and said first and second diffusion layers constituting a MOS transistor; and a first field shield electrode disposed on a first side of said first and second diffusion layers in said second direction, said first field shield electrode having first and second edges arranged in said second direction, said first contact pad having first and second edges arranged in said second direction, wherein said second edge of said first field shield electrode is closer to said first and second diffusion layers than is said first edge of said first field shield electrode as viewed in a third direction orthogonal to both of said first and second directions, wherein said second edge of said first contact pad is closer to said first and second diffusion layers than is said first edge of said first contact pad as viewed in said third direction, and wherein said first edge of said first field shield electrode is closer to said first and second diffusion layers than is said first edge of said first contact pad as viewed in said third direction.

26. The field shield isolated transistor according to claim 25, further comprising:

a second field shield electrode disposed on a second side of said first and second diffusion layers in said second direction, said second side being opposite from said first side, said gate electrode further including a second contact pad, said second field shield electrode having first and second edges arranged in said second direction, said second contact pad having first and second edges arranged in said second direction, wherein said first edge of said second field shield electrode is closer to said first and second diffusion layers than is said second edge of said second field shield electrode as viewed in said third direction, wherein said first edge of said second contact pad is closer to said first and second diffuision layers than is said second edge of said second contact pad as viewed in said third direction, and wherein said second edge of said second field shield electrode is closer to said first and second diffusion layers than is said second edge of said second contact pad as viewed in said third direction.

27. The field shield isolated transistor according to claim 25, further comprising:

a second field shield electrode disposed on a second side of said first and second diffusion layers in said second direction, said second side being opposite from said first side, said gate electrode further including a second contact pad, said second field shield electrode having first and second edges arranged in said second direction, said second contact pad having first and second edges arranged in said second direction, wherein said first edge of said second field shield electrode is closer to said first and second diffusion layers than is said second edge of said second field shield electrode as viewed in said third direction, wherein said first edge of said second contact pad is closer to said first and second diffusion layers than is said second edge of said second contact pad as viewed in said third direction, and wherein said first edge of said second contact pad is closer to said first and second diffusion layers than is said first edge of said second field shield electrode as viewed in said third direction.

28. The field shield isolated transistor according to claim 25, wherein said second edge of said first contact pad is closer to said first and second diffusion layers than is said second edge of said first field shield electrode as viewed in said third direction.

29. The field shield isolated transistor according to claim 28, further comprising:

a second field shield electrode disposed on a second side of said first and second diffusion layers in said second direction, said second side being opposite from said first side, said gate electrode further including a second contact pad, said second field shield electrode having first and second edges arranged in said second direction, said second contact pad having first and second edges arranged in said second direction, wherein said first edge of said second field shield electrode is closer to said first and second diffusion layers than is said second edge of said second field shield electrode as viewed in said third direction, wherein said first edge of said second contact pad is closer to said first and second diffusion layers than is said second edge of said second contact pad as viewed in said third direction, wherein said first edge of said second contact pad is closer to said first and second diffusion layers than is said first edge of said second field shield electrode as viewed in said third direction, and wherein said second edge of said second field shield electrode is closer to said first and second diffusion layers than is said second edge of said second contact pad as viewed in said third direction.

30. The field shield isolated transistor according to claim 22, wherein said first field shield electrode is buried in and surrounded by a first oxide film under said first contact pad, wherein said first oxide film has first and second edges arranged in said second direction, wherein said second edge of said first oxide film is closer to said first and second diffusion layers than is said first edge of said first oxide film as viewed in said third direction, wherein said first edge of said first contact pad is closer to said first and second diffusion layers than is said first edge of said first oxide film as viewed in said third direction, and wherein said second edge of said first oxide film is closer to said first and second diffusion layers than is said second edge of said first contact pad as viewed in said third direction.

31. The field shield isolated transistor according to claim 23, wherein said first field shield electrode is buried in and surrounded by a first oxide film under said first contact pad, wherein said first oxide film has first and second edges arranged in said second direction, wherein said second edge of said first oxide film is closer to said first and second diffusion layers than is said first edge of said first oxide film as viewed in said third direction, wherein said first edge of said first contact pad is closer to said first and second diffusion layers than is said first edge of said first oxide film as viewed in said third direction, and wherein said second edge of said first oxide film is closer to said first and second diffusion layers than is said second edge of said first contact pad as viewed in said third direction.

32. The field shield isolated transistor according to claim 26, wherein said first field shield electrode is buried in and surrounded by a first oxide film under said first contact pad, wherein said first oxide film has first and second edges arranged in said second direction, wherein said second edge of said first oxide film is closer to said first and second diffusion layers than is said first edge of said first oxide film as viewed in said third direction, wherein said first edge of said first contact pad is closer to said first and second diffusion layers than is said first edge of said first oxide film as viewed in said third direction, and wherein said second edge of said first oxide film is closer to said first and second diffusion layers than is said second edge of said first contact pad as viewed in said third direction.

33. The field shield isolated transistor according to claim 27, wherein said first field shield electrode is buried in and surrounded by a first oxide film under said first contact pad, wherein said first oxide film has first and second edges arranged in said second direction, wherein said second edge of said first oxide film is closer to said first and second diffusion layers than is said first edge of said first oxide film as viewed in said third direction, wherein said first edge of said first contact pad is closer to said first and second diffusion layers than is said first edge of said first oxide film as viewed in said third direction, and wherein said second edge of said first oxide film is closer to said first and second diffusion layers than is said second edge of said first contact pad as viewed in said third direction.

34. The field shield isolated transistor according to claim 28, wherein said first field shield electrode is buried in and surrounded by a first oxide film under said first contact pad, wherein said first oxide film has first and second edges arranged in said second direction, wherein said second edge of said first oxide film is closer to said first and second diffusion layers than is said first edge of said first oxide film as viewed in said third direction, wherein said first edge of said first contact pad is closer to said first and second diffusion layers than is said first edge of said first oxide film as viewed in said third direction, and wherein said second edge of said first oxide film is closer to said first and second diffusion layers than is said second edge of said first contact pad as viewed in said third direction.

35. The field shield isolated transistor according to claim 30, wherein part of said first oxide film which is positioned adjacent to at least one of said first and second edges of said first oxide film is recessed so that the profile of said part is convex toward said semiconductor substrate.

36. The field shield isolated transistor according to claim 31, wherein part of said first oxide film which is positioned adjacent to at least one of said first and second edges of said first oxide film is recessed so that the profile of said part is convex toward said semiconductor substrate.

37. The field shield isolated transistor according to claim 32, wherein part of said first oxide film which is positioned adjacent to at least one of said first and second edges of said first oxide film is recessed so that the profile of said part is convex toward said semiconductor substrate.

38. The field shield isolated transistor according to claim 33, wherein part of said first oxide film which is positioned adjacent to at least one of said first and second edges of said first oxide film is recessed so that the profile of said part is convex toward said semiconductor substrate.

39. The field shield isolated transistor according to claim 34, wherein part of said first oxide film which is positioned adjacent to at least one of said first and second edges of said first oxide film is recessed so that the profile of said part is convex toward said semiconductor substrate.

40. The field shield isolated transistor according to claim 27, wherein said second field shield electrode is buried in and surrounded by a second oxide film under said second contact pad, wherein said second oxide film has first and second edges arranged in said second direction, wherein said first edge of said second oxide film is closer to said first and second diffusion layers than is said second edge of said second oxide film as viewed in said third direction, wherein said second edge of said second contact pad is closer to said first and second diffusion layers than is said second edge of said second oxide film as viewed in said third direction, and wherein said first edge of said second oxide film is closer to said first and second diffusion layers than is said first edge of said second contact pad as viewed in said third direction.

41. An isolated transistor comprising:

first and second diffusion layers formed in a semiconductor substrate extending in first and second directions orthogonal to each other, said first and second diffusion layers being arranged in said first direction;

a gate oxide film formed on said semiconductor substrate between said first diffusion layer and said second diffusion layer;

a gate electrode including a coupling portion formed on said gate oxide film and a first contact pad, said gate electrode and said first and second diffusion layers constituting a MOS transistor; and a first insulator disposed on a first side of said first and second diffusion layers in said second direction, said first insulator having first and second shoulders arranged in said second direction, said first contact pad having first and second edges arranged in said second direction, wherein said second shoulder of said first insulator is closer to said first and second diffusion layers than is said first shoulder of said first insulator as viewed in a third direction orthogonal to both of said first and second directions, wherein said second edge of said first contact pad is closer to said first and second diffusion layers than is said first edge of said first contact pad as viewed in said third direction, and wherein said second edge of said first contact pad is closer to said first and second diffusion layers than is said second shoulder of said first insulator as viewed in said third direction.

42. The isolated transistor according to claim 41, further comprising:

a second insulator disposed on a second side of said first and second diffusion layers in said second direction, said second side being opposite from said first side, said gate electrode further including a second contact pad, said second insulator having first and second shoulders arranged in said second direction, said second contact pad having first and second edges arranged in said second direction, wherein said first shoulder of said second insulator is closer to said first and second diffusion layers than is said second shoulder of said second insulator as viewed in said third direction, wherein said first edge of said second contact pad is closer to said first and second diffusion layers than is said second edge of said second contact pad as viewed in said third direction, and wherein said first edge of said second contact pad is closer to said first and second diffusion layers than is said first shoulder of said second insulator as viewed in said third direction.

43. The isolated transistor according to claim 41, wherein said first shoulder of said first insulator is closer to said first and second diffusion layers than is said first edge of said first contact pad as viewed in said third direction.

44. An isolated transistor comprising:

first and second diffusion layers formed in a semiconductor substrate extending in first and second directions orthogonal to each other, said first and second diffusion layers being arranged in said first direction;

a gate oxide film formed on said semiconductor substrate between said first diffusion layer and said second diffusion layer;

a gate electrode including a coupling portion formed on said gate oxide film and a first contact pad, said gate electrode and said first and second diffusion layers constituting a MOS transistor; and a first insulator disposed on a first side of said first and second diffusion layers in said second direction, said first insulator having first and second shoulders arranged in said second direction, said first contact pad having first and second edges arranged in said second direction, wherein said second shoulder of said first insulator is closer to said first and second diffusion layers than is said first shoulder of said first insulator as viewed in a third direction orthogonal to both of said first and second directions, wherein said second edge of said first contact pad is closer to said first and second diffusion layers than is said first edge of said first contact pad as viewed in said third direction, and wherein said first shoulder of said first insulator is closer to said first and second diffusion layers than is said first edge of said first contact pad as viewed in said third direction.

45. The isolated transistor according to claim 44, further comprising:

a second insulator disposed on a second side of said first and second diffusion layers in said second direction, said second side being opposite from said first side, said gate electrode further including a second contact pad, said second insulator having first and second shoulders arranged in said second direction, said second contact pad having first and second edges arranged in said second direction, wherein said first shoulder of said second insulator is closer to said first and second diffusion layers than is said second shoulder of said second insulator as viewed in said third direction, wherein said first edge of said second contact pad is closer to said first and second diffusion layers than is said second edge of said second contact pad as viewed in said third direction, and wherein said second shoulder of said second insulator is closer to said first and second diffusion layers than is said second edge of said second contact pad as viewed in said third direction.

46. The isolated transistor according to claim 44, further comprising:

a second insulator disposed on a second side of said first and second diffusion layers in said second direction, said second side being opposite from said first side, said gate electrode further including a second contact pad, said second insulator having first and second shoulders arranged in said second direction, said second contact pad having first and second edges arranged in said second direction, wherein said first shoulder of said second insulator is closer to said first and second diffusion layers than is said second shoulder of said second insulator as viewed in said third direction, wherein said first edge of said second contact pad is closer to said first and second diffusion layers than is said second edge of said second contact pad as viewed in said third direction, and wherein said first edge of said second contact pad is closer to said first and second diffusion layers than is said first shoulder of said second insulator as viewed in said third direction.

47. The isolated transistor according to claim 44, wherein said second edge of said first contact pad is closer to said first and second diffusion layers than is said second edge of said first field shield electrode as viewed in said third direction.

* * * * *